United States Patent
Tanigawa

(10) Patent No.: US 9,396,942 B2
(45) Date of Patent: Jul. 19, 2016

(54) SUBSTRATE AND MANUFACTURING METHOD THEREOF, AND SEMICONDUCTOR DEVICE

(71) Applicant: AISIN SEIKI KABUSHIKI KAISHA, Kariya-shi, Aichi-ken (JP)

(72) Inventor: Tatsuya Tanigawa, Anjo (JP)

(73) Assignee: AISIN SEIKI KABUSHIKI KAISHA, Aichi-ken (JP)

(*) Notice: Subject to any disclaimer, the term of this patent is extended or adjusted under 35 U.S.C. 154(b) by 0 days.

(21) Appl. No.: 14/819,690

(22) Filed: Aug. 6, 2015

(65) Prior Publication Data

US 2016/0079061 A1    Mar. 17, 2016

(30) Foreign Application Priority Data

Sep. 16, 2014 (JP) .................................. 2014-187654

(51) Int. Cl.
| | |
|---|---|
| H01L 21/48 | (2006.01) |
| H01L 21/02 | (2006.01) |
| H01L 21/268 | (2006.01) |
| H01L 29/20 | (2006.01) |
| H01L 29/06 | (2006.01) |
| H01L 33/00 | (2010.01) |
| H01L 33/22 | (2010.01) |
| H01L 33/32 | (2010.01) |

(52) U.S. Cl.
CPC ...... *H01L 21/02658* (2013.01); *H01L 21/0254* (2013.01); *H01L 21/268* (2013.01); *H01L 29/0688* (2013.01); *H01L 29/2003* (2013.01); *H01L 33/0075* (2013.01); *H01L 33/22* (2013.01); *H01L 33/32* (2013.01)

(58) Field of Classification Search
CPC ......... H01L 21/44; H01L 21/48; H01L 21/50; H01L 21/56; H01L 21/0268; H01L 21/0485

USPC ............................... 257/77–82; 438/484, 795
See application file for complete search history.

(56) References Cited

U.S. PATENT DOCUMENTS

| | | | |
|---|---|---|---|
| 6,348,096 B1 | 2/2002 | Sunakawa et al. | |
| 6,579,359 B1* | 6/2003 | Mynbaeva | C30B 25/02 117/107 |
| 6,940,098 B1 | 9/2005 | Tadatomo et al. | |
| 7,851,343 B2* | 12/2010 | Mayer | H01L 21/0485 257/E21.294 |
| 2005/0104072 A1* | 5/2005 | Slater, Jr. | H01L 21/0485 257/77 |
| 2007/0072396 A1* | 3/2007 | Feltin | C30B 25/02 438/478 |
| 2008/0132088 A1* | 6/2008 | Mizuno | H01L 21/0268 438/795 |
| 2008/0153039 A1* | 6/2008 | Akimoto | H01L 21/263 430/313 |
| 2008/0191023 A1* | 8/2008 | Harris | G06K 19/06028 235/462.1 |
| 2010/0047587 A1* | 2/2010 | Itoh | B29C 65/1654 428/426 |
| 2012/0111495 A1* | 5/2012 | Shimoi | B23K 26/0057 156/250 |
| 2015/0076518 A1* | 3/2015 | Tanigawa | H01L 21/0485 257/77 |
| 2016/0052090 A1* | 2/2016 | Tanigawa | B23K 26/0624 219/121.69 |

FOREIGN PATENT DOCUMENTS

| | | |
|---|---|---|
| JP | 4743214 B2 | 8/2011 |
| JP | 4766071 B2 | 9/2011 |

* cited by examiner

*Primary Examiner* — Michael Lebentritt
(74) *Attorney, Agent, or Firm* — Sughrue Mion, PLLC

(57) ABSTRACT

A substrate includes a base substrate including a processed portion processed by irradiation with an ultrashort-pulse laser light and an unprocessed portion which is not irradiated with the ultrashort-pulse laser light, the processed portion and the unprocessed portion are on a surface of the base substrate, and a semiconductor crystal layer crystal-grown at least on the unprocessed portion of the base substrate.

8 Claims, 16 Drawing Sheets

F I G. 8 A
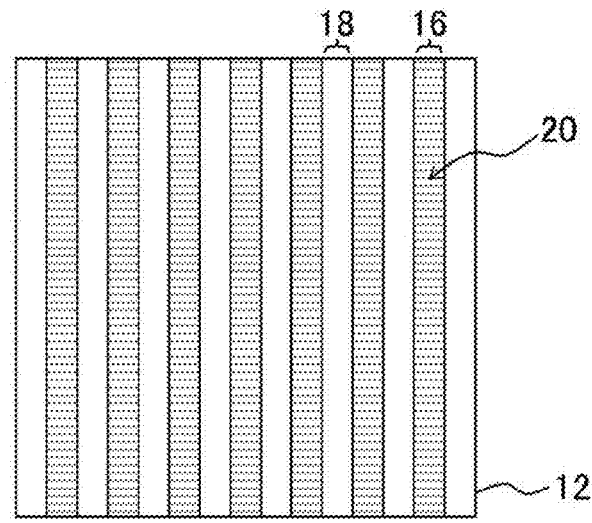
F I G. 8 B
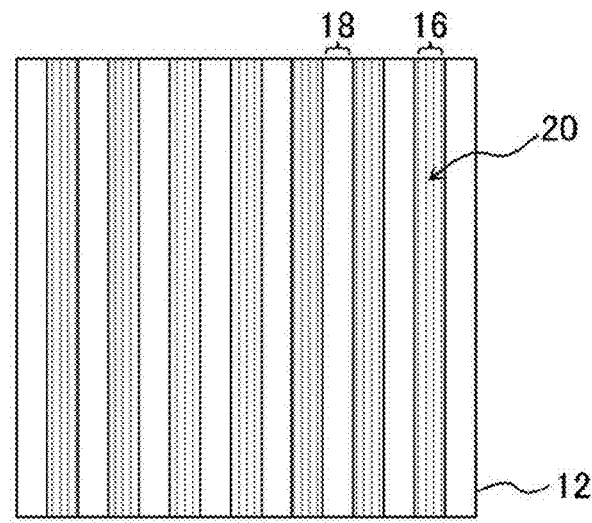
F I G. 8 C
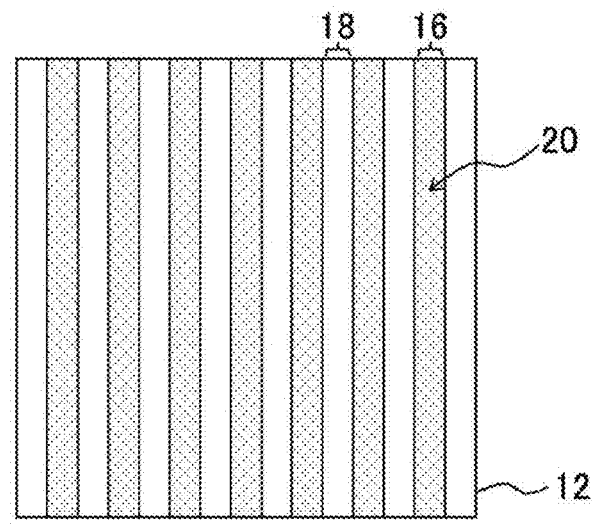

SUBSTRATE AND MANUFACTURING METHOD THEREOF, AND SEMICONDUCTOR DEVICE

CROSS REFERENCE TO RELATED APPLICATIONS

This application is based on and claims priority under 35 U.S.C. §119 to Japanese Patent Application 2014-187654, filed on Sep. 16, 2014, the entire content of which is incorporated herein by reference.

TECHNICAL FIELD

This disclosure generally relates to a substrate and a manufacturing method thereof, and a semiconductor device.

BACKGROUND DISCUSSION

In manufacturing a semiconductor device, a semiconductor crystal layer is grown, that is, crystal growth is conducted, on a crystal substrate serving as a base. For example, gallium nitride (GaN), which is one of III-V compound semiconductors, is epitaxially-grown on a base crystal substrate including a silicon carbide (SiC) substrate, a silicon (Si) substrate and a sapphire substrate.

It is known that, however, in a case where a lattice constant and/or a thermal expansion coefficient of the base crystal substrate differ from a lattice constant and/or a thermal expansion coefficient of a crystal growth layer that is to be grown, a defect and/or distortion occur to the crystal growth layer, and thus it is difficult that an appropriate semiconductor crystal layer is obtained. Thus, for the purpose of reducing, for example, the defects at the crystal growth layer, a method of growing a semiconductor crystal layer is suggested, in which selective growth is employed. In the selective growth, a substrate formed with masks or with protrusions and recesses is used as the base crystal substrate (refer to JP4743214B and JP4766071B which will be hereinafter referred to as Patent reference 1 and Patent reference 2, respectively).

According to the method described in Patent reference 1, first, growth areas are formed on a substrate surface with the use of a mask material including oxide silicon ($SiO_2$). Next, a GaN-based semiconductor including a facet structure is formed in the growth area formed on the substrate surface. Next, plural GaN-based semiconductors including the facet structures are grown and a dislocation is bent, and the plural GaN-based semiconductors are combined with each other or touch with each other at an upper portion of the mask material or the mask material is covered with the GaN-based semiconductors.

According to the method described in Patent reference 2, a substrate of which a crystal growth surface corresponds to a recess/protrusion surface including protruding portions arranged in a lattice configuration is prepared by, for example, Reactive Ion Etching (RIE). Next, a crystalline layer of $Al_xGa_{1-x-y}In_yN$ ($0 \leq x \leq 1$, $0 \leq y \leq 1$) is vapor-grown or vapor-deposited from upper portions of the protruding portions of the substrate. Further, the recess/protrusion surface is covered with the vapor-grown crystalline layer from the upper portions of the protruding portions.

According to the method described in Patent reference 1, however, patterning needs to be applied to the mask material by photolithography and etching, which increases the number of processes or steps, and accordingly increasing costs. In addition, because the mask material is covered with the crystalline layer, the mask material diffuses on the crystalline layer on the mask material. As a result, autodoping, in which the mask material functions as impurity substance in the crystalline layer, may occur.

On the other hand, according to the method described in Patent reference 2, recessed portions of the recess/protrusion surface formed on the substrate are in a surface state in which the crystal can grow thereon. Accordingly, a growth condition of the crystal is extremely restricted in order to prioritize the growth at the protruding portions of the recess/protrusion surface, and thus decline in a crystal quality may be induced. In addition, because the recessed portions are in the surface state that allows the crystal to grow, it is difficult for an appropriate selective growth to occur. Further, abnormal growth may occur due to the crystal growth at the recessed portions.

A need thus exists for a substrate and a manufacturing method thereof, and a semiconductor device, which are not susceptible to the drawback mentioned above.

SUMMARY

According to an aspect of this disclosure, a substrate includes a base substrate including a processed portion processed by irradiation with an ultrashort-pulse laser light and an unprocessed portion which is not irradiated with the ultrashort-pulse laser light, the processed portion and the unprocessed portion are on a surface of the base substrate, and a semiconductor crystal layer crystal-grown at least on the unprocessed portion of the base substrate.

According to another aspect of this disclosure, a semiconductor device includes a base substrate including a processed portion processed by irradiation with an ultrashort-pulse laser light and an unprocessed portion which is not irradiated with the ultrashort-pulse laser light, the processed portion and the unprocessed portion are formed on a surface of the base substrate, the base substrate including on the surface thereof a first region in which a plurality of the processed portions are formed and a second region in which a plurality of the processed portions are formed with a higher density than in the first region, and a semiconductor crystal layer crystal-grown in the first region, the semiconductor crystal layer being not crystal-grown in the second region.

According to another aspect of this disclosure, a manufacturing method of a substrate, the manufacturing method includes a laser processing process of irradiating a surface of a base substrate with an ultrashort-pulse laser light and thereby forming a processed portion on the surface of the base substrate, and a first crystal growth process of crystal-growing a semiconductor crystal layer on an unprocessed portion of the surface of the base substrate, the unprocessed portion being not irradiated with the ultrashort-pulse laser light.

BRIEF DESCRIPTION OF THE DRAWINGS

The foregoing and additional features and characteristics of this disclosure will become more apparent from the following detailed description considered with the reference to the accompanying drawings, wherein:

FIG. 8A is a plan view illustrating an example of the nano periodic structure of the processed portion including a band-shaped planar configuration and forming a line and space pattern;

FIG. 8B is a plan view illustrating an example of the nano periodic structure of the processed portion including the band-shaped planar configuration and forming the line and space pattern;

FIG. 8C a plan view illustrating an example of the nano periodic structure of the processed portion including the band-shaped planar configuration and forming the line and space pattern;

DETAILED DESCRIPTION

Embodiments disclosed here will be described with reference to drawings. This disclosure is not limited to the following embodiments and may be appropriately changed or modified without departing from a subject matter of the disclosure. A substrate and a manufacturing method thereof, and a semiconductor device which are according to a first embodiment disclosed here will be described with reference to FIGS. 1 to 12C.

First, the substrate according to the present embodiment will be described with reference to FIG. 1.

Figure 1:
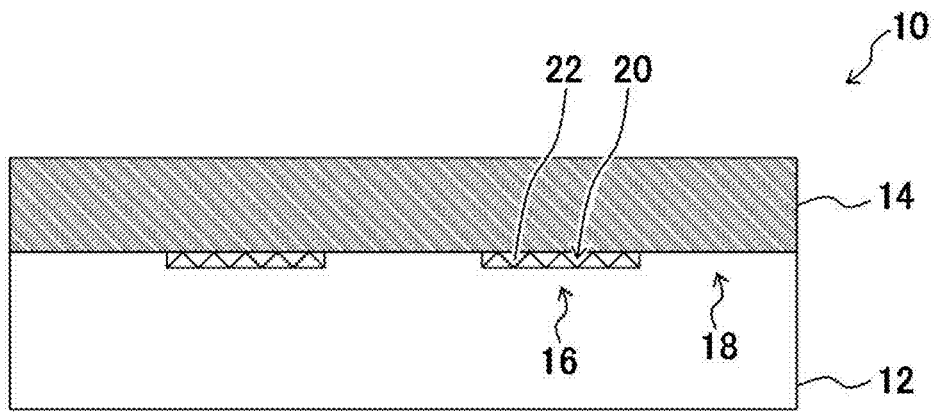
FIG. 1 is a cross-sectional view illustrating a substrate according to a first embodiment disclosed here.

As illustrated in FIG. 1, a substrate 10 of the present embodiment includes a base crystal substrate 12 (i.e., a base substrate) formed from an n type conductive 6H-SiC substrate and a semiconductor crystal layer 14 formed from GaN that is crystal-grown on the base crystal substrate 12.

A processed portion 16 processed by irradiation with an ultrashort-pulse laser light is formed at a surface of the base crystal substrate 12. Other region of the surface of the base crystal substrate 12 than the processed portion 16 is an unprocessed portion 18 that has not been irradiated with the ultrashort-pulse laser light.

The processed portion 16 is formed in a planar shape having an elongated band configuration and includes a shallow stepped configuration having a depth of, for example, approximately 100 nm to 2000 nm. Plural processed portions 16, each being in the elongated band shape, are formed at the surface of the base crystal substrate 12 to be arranged in a predetermined direction while being spaced at a predetermined distance. A width of each processed portion 16 is, for example, 0.5 μm to 5 μm. A width of the unprocessed portion 18 arranged between the adjacent processed portions 16 is also 0.5 μm to 5 μm, for example. Accordingly, a line and space pattern, which serves as a periodic pattern, is formed by the plural processed portions 16 at the surface of the base crystal substrate 12.

A nano periodic structure 20 is formed at a surface within or inside each processed portion 16. The nano periodic structure 20 is a periodic fine protrusion/recess structure including a cycle of nanometer order. It is known that, in a case where the ultrashort-pulse laser light including, for example, a femtosecond laser light, is irradiated or delivered to a surface of a material, with energy that is equal to or greater than a predetermined threshold value, a surface layer of the material can be evaporated while the surface of the material is prevented from being heated. This phenomenon is referred to as abrasion and the threshold value of the energy causing the abrasion is referred to as a process threshold value. It is also known that, in a case where a surface of a substrate made of metal material or semiconductor material, for example, is irradiated with the ultrashort-pulse laser light having energy which is in the vicinity of a process threshold value of the substrate, phenomenon occurs where a fine periodic structure of which a cycle is close to a wavelength of the ultrashort-pulse laser light is formed. The nano periodic structure 20 inside the processed portion 16 is formed by the above-described phenomenon caused by the irradiation of the ultrashort-pulse laser light. The ultrashort-pulse laser light, for example, the femtosecond laser light, which can be used for forming the processed portion 16 will be described below.

The semiconductor crystal layer 14, which is formed from GaN and of which a thickness is, for example, 2000 nm is crystal-grown on the base crystal substrate 12 including the processed portions 16. The semiconductor crystal layer 14 is crystal-grown from the unprocessed portion 18 of the base crystal substrate 12 on the base crystal substrate 12 and is crystal-grown in a lateral direction to cover the processed portion 16. A surface of the semiconductor crystal layer 14 is substantially flat.

The semiconductor crystal layer 14 covering the processed portion 16 does not fill in the processed portion 16 including the stepped configuration. Thus, an air gap 22, that is, a void, is generated between the semiconductor crystal layer 14 covering the processed portion 16 and the surface within the processed portion 16.

The substrate 10 of the present embodiment is configured as described above. According to the substrate 10 of the present embodiment, the semiconductor crystal layer 14 is crystal-grown on the base crystal substrate 12. The surface of the base crystal substrate 12 includes the processed portions 16 processed by irradiation with the ultrashort-pulse laser light. Thus, the semiconductor crystal layer 14 includes an appropriate quality while a defect and/or, distortion or deformation is reduced and abnormal growth is restrained from occurring as will be described below.

Next, the semiconductor device according to the present embodiment will be described with reference to FIG. 2. The semiconductor device of the present embodiment uses the substrate 10 of the present embodiment which is illustrated in FIG. 1. A device structure of a semiconductor device 24 of the present embodiment is formed on the semiconductor crystal layer 14 of the substrate 10. Specifically, the semiconductor device 24 is light emitting diode (LED) which is one of light emitting devices.

Figure 2:
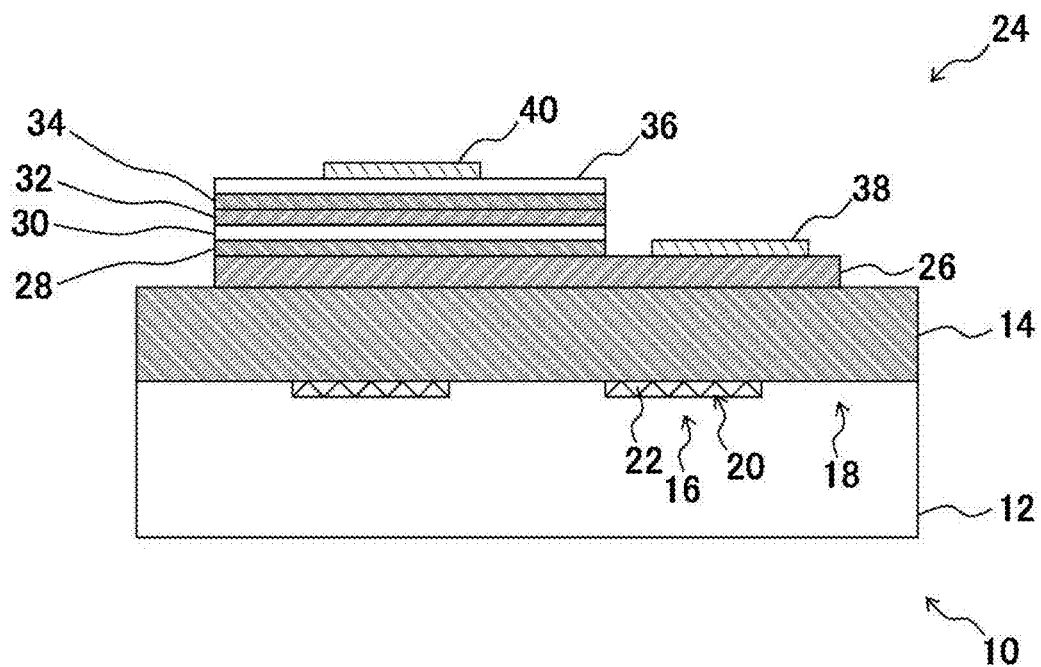
FIG. 2 is a cross-sectional view illustrating a semiconductor device according to the first embodiment.

As illustrated in FIG. 2, an n type contact layer 26 which is formed from n type GaN and of which a thickness is, for example, 3000 nm is formed on the semiconductor crystal layer 14 of the substrate 10. The n type contact layer 26 is doped with Si serving as impurity substance at a concentration of, for example, $4 \times 10^{18}$ cm$^{-3}$.

An n type clad layer 28 which is formed from aluminum gallium nitride (AlGaN) and of which a thickness is, for example, 200 nm is formed on the n type contact layer 26. The n type clad layer 28 is doped with Si serving as impurity substance at a concentration of, for example, $1 \times 10^{18}$ cm$^{-3}$. The n type contact layer 26 is provided with a region for an electrode to be formed where the n type clad layer 28 is not formed.

As an active layer, a multiple quantum well layer 30 is formed on the n type clad layer 28. The multiple quantum well layer 30 is formed from, for example, three barrier layers and three well layers which are arranged in a manner that the barrier layers and the well layers are alternately layered on one another, and that the topmost layer is the barrier layer. Each barrier layer is formed from a non-doped GaN and includes a thickness of 4 nm, for example. Each well layer is formed from a non-doped indium gallium nitride ($In_{0.3}Ga_{0.7}N$) and includes a thickness of 3 nm, for example.

A p type clad layer 32 which is formed from p type AlGaN and of which a thickness is, for example, 100 nm is formed on the multiple quantum well layer 30. The p type clad layer 32 is doped with magnesium (Mg) serving as impurity substance at a concentration of, for example, $5 \times 10^{18}$ cm$^{-3}$.

A p type contact layer 34 of which a thickness is, for example, 500 nm and which is formed from p type GaN is formed on the p type clad layer 32. The p type contact layer 34 is doped with Mg serving as impurity substance at a concentration of, for example, $5 \times 10^{19}$ cm$^{-3}$.

A transparent electrode 36 which is formed from transparent conductive oxide such as, for example, indium tin oxide (ITO) and of which a thickness is, for example, 100 nm is formed on the p type contact layer 34.

An n type electrode 38 is formed in a region of the n type contact layer 26 in which the n type clad layer 28 is not formed. The n type electrode 38 is formed from a titanium (Ti) film formed on the n type contact layer 26 and an aluminum (Al) film formed on the Ti film.

A p type electrode 40 is formed on the transparent electrode 36. The p type electrode 40 is formed from a nickel (Ni) film formed on the transparent electrode 36 and a gold (Au) film formed on the Ni film.

In consequence, the semiconductor device 24, which uses the substrate 10, of the present embodiment is configured as described above. According to the semiconductor device 24 of the present embodiment, the n type contact layer 26, the n type clad layer 28, the multiple quantum well layer 30, the p type clad layer 32 and the p type contact layer 34 which constitute the device structure are formed on the semiconductor crystal layer 14 including the high quality. Thus, according to the semiconductor device 24 of the present embodiment, also the n type contact layer 26, the n type clad layer 28, the multiple quantum well layer 30, the p type clad layer 32 and the p type contact layer 34 include the high qualities. Consequently, an appropriate or excellent device characteristic is achieved.

Next, the manufacturing method of the substrate according to the present embodiment will be described with reference to FIGS. 3A to 11.

Figure 3A:
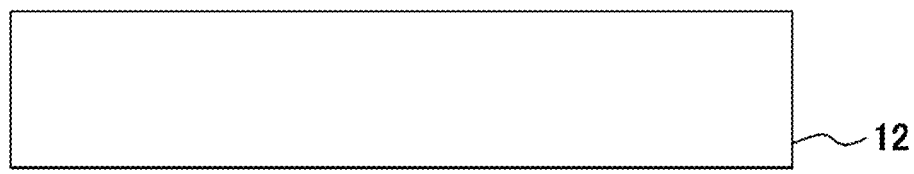
FIG. 3A is a cross-sectional view (first cross-sectional view) illustrating a process of a manufacturing method of a substrate according to the first embodiment.

First, as illustrated in FIG. 3A, the base crystal substrate 12 formed from the n type conductive 6H-SiC substrate is prepared as the base crystal substrate 12 on which the semiconductor crystal layer 14 is to be crystal-grown.

Figure 3B:
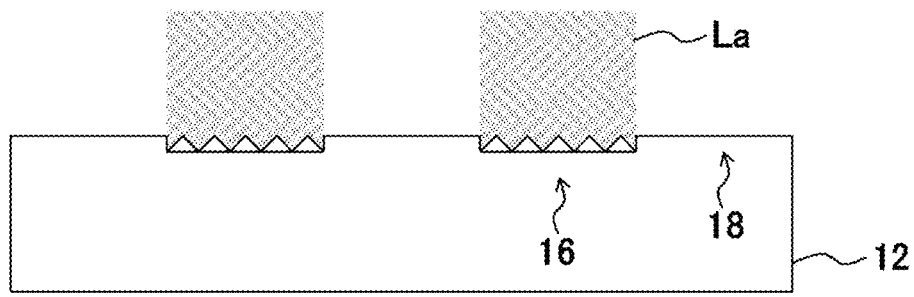
FIG. 3B is a cross-sectional view (first cross-sectional view) illustrating a process of the manufacturing method of the substrate according to the first embodiment.

Next, as illustrated in FIG. 3B, the surface of the base crystal substrate 12 is irradiated with an ultrashort-pulse laser La and thus the plural processed portions 16 are formed on the surface of the base crystal substrate 12 (a laser processing process). Each of the plural processed portions 16 processed by the irradiation of the ultrashort-pulse laser La is formed in the shallow stepped configuration of which a depth is, for example, 100 nm to 2000 nm and which includes the band-shaped planar configuration. At the surface of the base crystal substrate 12, the line and space pattern is formed or defined by the plural processed portions 16. In addition, at the surface inside each of the processed portions 16, the nano periodic structure 20 is formed by the abrasion caused by the irradiation of the ultrashort-pulse laser.

Figure 4:
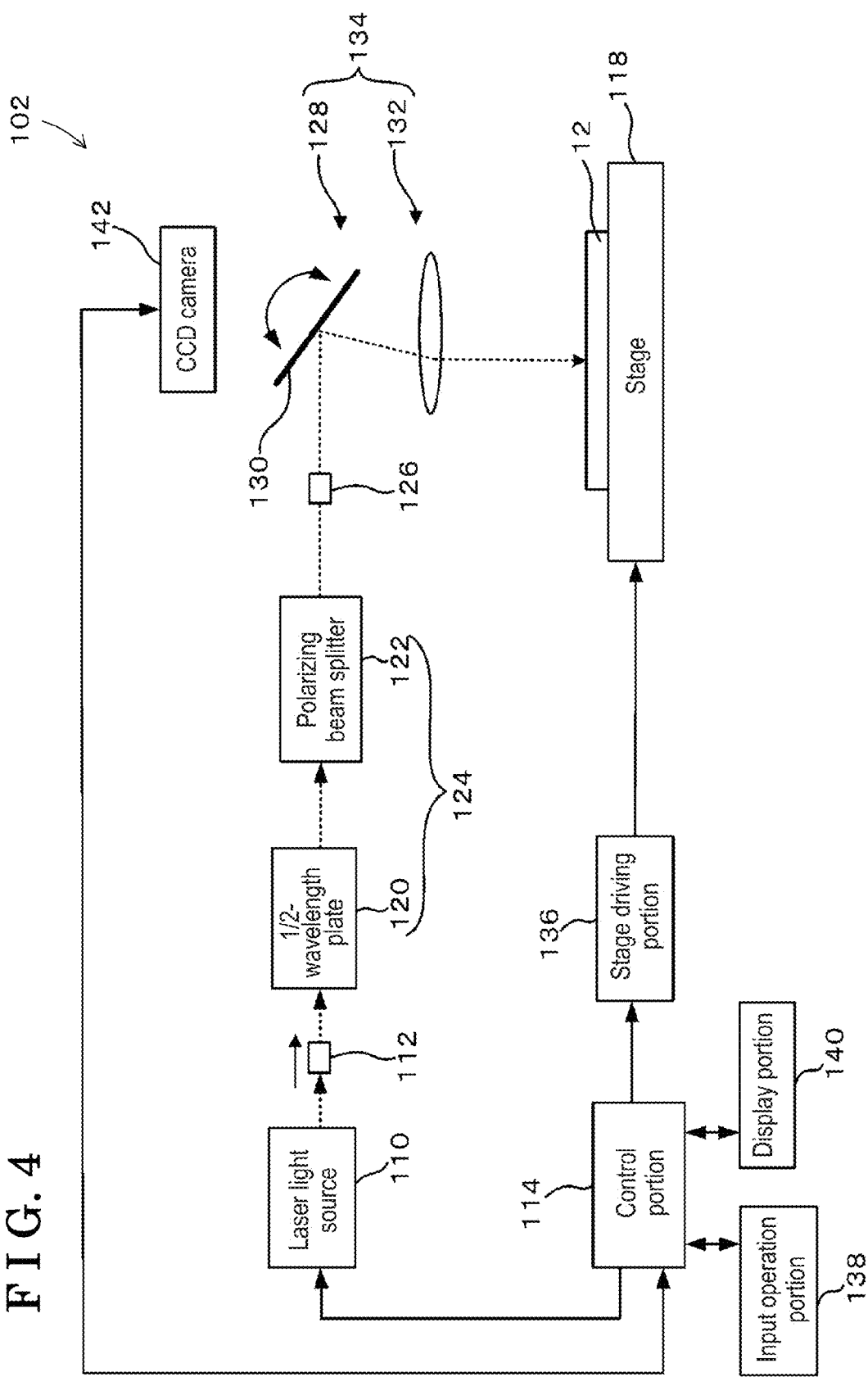
FIG. 4 is a schematic view illustrating a laser processing apparatus according to the first embodiment.

The laser processing apparatus according to the present embodiment, which is for forming the processed portion 16 on the surface of the base crystal substrate 12 as described above, will be explained with reference to FIGS. 4 and 5. In FIG. 4, connection among components of the laser processing apparatus is drawn with solid lines and an optical path of a laser light is drawn with dotted lines.

A laser processing apparatus 102 according to the present embodiment irradiates the surface of the base crystal substrate 12 with a laser beam, thereby forming the processed portion 16 including the nano periodic structure 20.

The laser processing apparatus 102 according to the present embodiment includes a laser light source 110 (i.e., a light source) emitting the laser light, a control portion 114 controlling the entire laser processing apparatus of the present embodiment. In addition, the laser processing apparatus 102 of the present embodiment includes a stage 118. The base crystal substrate 12, at which the processed portion 16 is to be formed, is placed on the stage 118.

The laser processing apparatus 102 according to the present embodiment is provided at a manufacturing apparatus manufacturing a product such as a substrate, for example.

The control portion 114 includes a central processing unit (CPU) executing the processing including various calculations, controls, discriminations. In addition, the control portion 114 includes, for example, read-only memory (ROM) which stores, for example, various control programs which are executed by the CPU. In addition, the control portion 114 includes, for example, random access memory (RAM) which temporarily stores, for example, data being processed by the CPU and/or input data.

An input operation portion 138 is connected to the control portion 114. The input operation portion 138 is for a user to input a predetermined command and/or data. For example, a keyboard and/or various switches are used as the input operation portion 138.

A display portion 140 for performing various display is connected to the control portion 114. On the display portion 140, for example, an operation status of the laser processing apparatus 102 of the present embodiment, a status of the stage 118, images obtained by a CCD camera 142 are displayed. For example, a liquid crystal display is used as the display portion 140.

The laser light source 110 is configured to emit the laser light (laser beam). Here, for example, an ultrashort-pulse laser light is used as the laser light. For example, a femtosecond laser light is used as the ultrashort-pulse laser light. Generally, the femtosecond laser light corresponds to pulse laser light of which a pulse width is femtosecond (fs: $10^{-15}$ second) order, that is, pulse laser light of which the pulse width is equal to or greater than 1 fs and is smaller than 1 ps. For example, a pulse laser beam of which the pulse width is femtosecond order is emitted from the laser light source 110. As the laser light source 110 of the present embodiment, for example, a laser oscillator of which a center wavelength is approximately 1.05 μm and of which a pulse width is approximately 500 fs is used. The ultrashort-pulse laser light is used in the present embodiment because the ultrashort-pulse laser light can achieve precision microfabrication without causing thermal melting.

Here, the explanation is made on a case where the pulse width of the laser light is approximately 500 fs, however, the pulse width of the laser light is not limited to approximately 500 fs. In addition, the pulse width of the laser light is not limited to femtosecond order and may be picosecond order. In the present disclosure, the ultrashort-pulse laser light is not limited to the laser light of which the pulse width is femtosecond, and the ultrashort-pulse laser light according to the present disclosure includes a picosecond laser light of which the pulse width is equal to or smaller than several tens of picoseconds. In addition, in the present disclosure, the femtosecond laser light is not limited to the laser light of which the pulse width is femtosecond, and the femtosecond laser light includes the picosecond laser light of which the pulse width is equal to or smaller than several tens of picoseconds.

In addition, a center wavelength of the laser light emitted from the laser light source is not limited to approximately 1.05 μm and may be set appropriately.

An output power of the laser light source 110 emitting the laser light is, for example, approximately 1 W. The output power of the laser light source 110 is not limited to approximately 1 W and may be set appropriately.

The laser light source 110 is controlled by the control portion 114. The pulse width of the laser light emitted from the laser light source 110 may be set appropriately by the setting of the laser light source 110. For example, various setting information inputted by the user is appropriately stored within a memory portion provided at the control portion 114. The control portion 114 controls the laser light source 110 so that the laser light is delivered to the surface of the base crystal substrate 12 and thus the processed portion 16 including the nano periodic structure 20 is formed. The irradiation of the laser light emitted from the laser light source 110 can be appropriately set by the user via the input operation portion 138. The control portion 114 causes the laser light source 110 to emit the pulse of the laser light at a repetition frequency or a repetition cycle that is set in advance.

Figure 5:
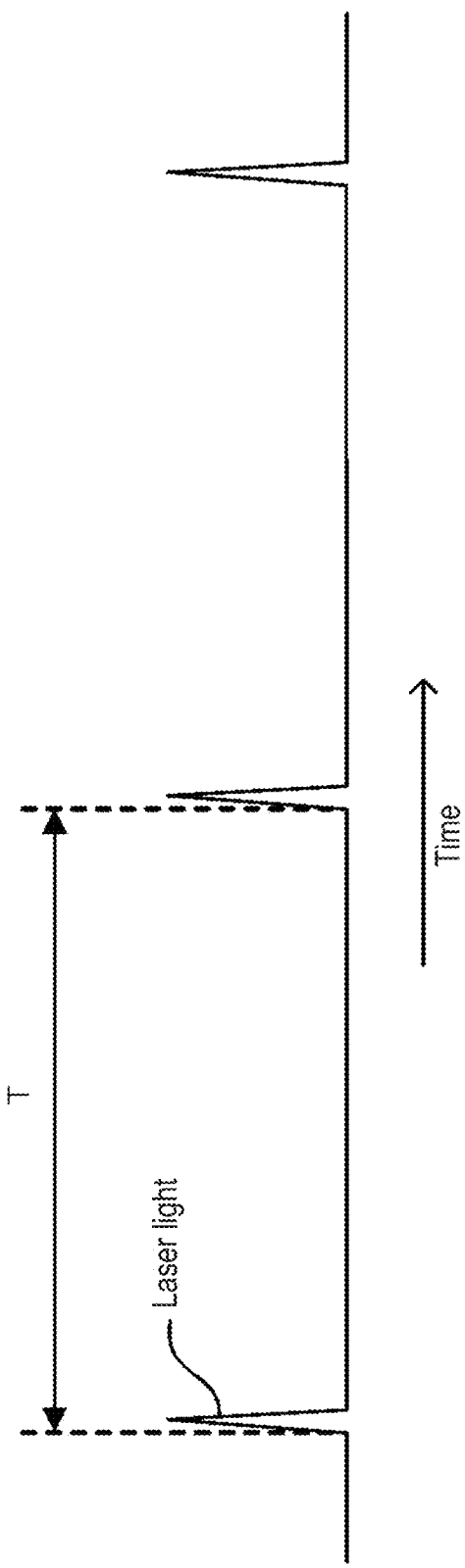
FIG. 5 is a time chart schematically illustrating a waveform of a laser light emitted from a laser light source.

As illustrated in FIG. 5, the pulse of the laser light is emitted from the laser light source 110 at a predetermined repetition cycle T. The pulse repetition frequency of the laser light is, for example, approximately 100 kHz to 1 MHz, more specifically, approximately 100 kHz. The pulse repetition frequency of the laser light can be appropriately set by the user via the input operation portion 138. The pulse repetition frequency of the laser light is not limited to approximately 100 kHz to 1 MHz and can be appropriately set.

A beam expander 112 for adjusting a beam radius of the laser light is provided downstream of, that is, at a rear phase relative to, the laser light source 110 emitting the laser light. A ½-wavelength plate 120 controlling a polarization direction of the laser light is provided downstream of the beam expander 112. A polarizing beam splitter 122 adjusting output of the laser light is provided downstream of the ½-wavelength plate 120. The ½-wavelength plate 120 is an optical device which changes the polarization direction of the laser light as the ½-wavelength plate 120 is rotated. The polarizing beam splitter 122 is an optical device which splits polarized component of an incident light. As the ½-wavelength plate 120 is rotated and accordingly the polarization direction of the laser light is changed, a ratio of polarization component that is split at the polarizing beam splitter 122 changes. By appropriately adjusting a rotational angle of the ½-wavelength plate 120, the power of the laser light emitted from the polarizing beam splitter 122 is appropriately adjusted. The ½-wavelength plate 120 and the polarizing beam splitter 122 constitute an output attenuator 124. Thus, laser intensity of the laser light emitted from the laser light 0 is configured to be adjusted by the output attenuator 124. The laser intensity of the laser light can be appropriately set by the user via the input operation portion 138.

Pulse energy (the laser intensity) of the laser light adjusted by the output attenuator 124, that is, the pulse energy of the laser light delivered to the base crystal substrate 12, is set so that a crack is not generated at the base crystal substrate 12 and the processed portion 16 including the nano periodic structure 20 is formed at the surface of the base crystal substrate 12. Here, the pulse energy of the laser light delivered to the surface of the base crystal substrate 12 is approximately 1 µJ/pulse to 50 µJ/pulse, for example. The pulse energy of the laser light delivered to the surface of the base crystal substrate 12 is not limited to approximately 1 µJ/pulse to 50 µJ/pulse and can be set appropriately.

Here, the explanation is made on a case where the laser intensity of the laser light is adjusted with the use of the output attenuator 124 constituted by the ½-wavelength plate 120 and the polarizing beam splitter 122, however, a unit or mechanism adjusting the intensity of the laser light is not limited thereto. The intensity of the laser light can be appropriately adjusted by using an arbitrary adjustment.

A beam expander 126 for adjusting the beam radius of the laser light is provided downstream of, that is, at a rear phase relative to, the output attenuator 124. A galvanic scanner 128 is provided downstream of the beam expander 126. The galvanic scanner 128 is an optical device which performs scanning with the laser light at a high speed by appropriately changing an angle of a mirror 130. The laser light that has entered the galvanic scanner 128, that is, the laser light that is incident on the mirror 130, is reflected at the mirror 130 of the galvanic scanner 128 and then is introduced to an FA lens (F-Theta) 132. The FA lens 132 is a lens used for laser scanning and includes a function of scanning the laser beam, the laser beam which was scanned at an equal angle by a rotational mirror, on an image plane at a constant speed. The galvanic scanner 128 and the FA lens 132 constitute a scanning optical system 134 performing two-dimensional scanning with the laser light. The scanning optical system 134 is controlled by the control portion 114 appropriately. The beam radius of the laser light at a light focus point (a focal point, a beam waist) of the laser light is approximately 1 µm to 50 µm, for example. The beam radius at the light focus point of the laser light is not limited to approximately 1 µm to 50 µm and may be set appropriately.

The stage 118 is positioned below the Fθ lens 132. The base crystal substrate 12 on which the processed portion 16 is to be formed is placed or mounted on the stage 118. A stage driving portion 136 for driving or actuating the stage 118 is connected to the stage 118. The control portion 114 drives the stage 118 via the stage driving portion 136. For example, an XY-axis stage, an XYZ-axis stage or an XYZθ-axis stage may be used as the stage 118. Ambient atmosphere of the base crystal substrate 12 that is arranged on the stage 118 is, for example, the atmosphere (air).

The CCD camera 142 is provided above the stage 118. The image obtained by the CCD camera 142 is inputted to the control portion 114. The control portion 114 uses the image obtained by the CCD camera 142 and performs, for example, a positioning of the base crystal substrate 12.

Before the scanning of the laser light relative to the base crystal substrate 12 is started, a position of the base crystal substrate 12 is set at a predetermined position. The control portion 114 appropriately controls the stage 118 via the stage driving portion 136, and thereby positioning the base crystal substrate 12 within a range in which the scanning with the laser light can be performed by the scanning optical system 134.

A direction of radiation of the laser light, that is, a light axis (a traveling direction) of the laser light entering the base crystal substrate 12, corresponds to a direction intersecting an in-plane direction of the surface of the base crystal substrate 12, more specifically, a normal direction of the surface of the base crystal substrate 12. On the other hand, a scanning direction of the laser light, that is, a direction in which the focus point of the laser light moves, corresponds to the in-plane direction of the surface of the base crystal substrate 12.

By controlling the scanning optical system 134, the scanning of the laser light relative to the base crystal substrate 12 is performed. The control relative to the scanning optical system 134 is conducted by, for example, the control portion 114. The scanning optical system 134 performs scanning with the laser light by rotating the mirror 130 of the galvanic scanner 128 appropriately. A scanning speed of the laser light can be appropriately set by the user via the input operation portion 138. The scanning speed of the laser light is, for example, approximately 0.5 m/s in a case where the pulse repetition frequency of the laser light is, for example, approximately 100 kHz. The scanning speed of the laser light is not limited to approximately 0.5 m/s and can be appropriately set.

A cross-sectional shape of the laser beam at the focus point is, for example, a circular shape. The cross-sectional shape of the laser beam at the focus point is not limited to circular. For example, the cross-sectional shape of the laser beam at the focus point may be an oval shape.

The light focus point of the laser light is the surface of the base crystal substrate 12, for example. By moving the stage 118 up and down in a normal direction of an upper surface of the stage 118, the light focus point of the laser light can be set at a desired portion.

The light focus point of the laser light does not need to match the surface of the base crystal substrate 12. For example, the light focus point of the laser light can be positioned slightly above or slightly below relative to the surface of the base crystal substrate 12. Even in a case where the light focus point of the laser light is slightly displaced from the surface of the base crystal substrate 12, the processed portion 16 including the nano periodic structure 20 can be formed.

Scanning of the laser light is performed within a predetermined pattern at the surface of the base crystal substrate 12. The pattern in which the scanning of the laser light is conducted, that is, a planned laser irradiation pattern, may be programmed into the control portion 114 in advance, or it may be configured in such a manner that the user sets the planned laser irradiation pattern via the input operation portion 138 before starting the scan with the laser light. When starting scanning with the laser light relative to the base crystal substrate 12, the user provides an instruction to start the scanning with the laser light via the input operation portion 138, for example. Once the instruction to start the scanning with the laser light is inputted, the control portion 114 conducts the scan with the laser light by using the scanning optical system 134 while the control portion 114 causing the laser light source 110 to emit the laser light repetitively. The scan with the laser light is conducted in a manner that the laser light draws, for example, a linear scanning path within the planned laser irradiation pattern on the stage 118. By performing the scanning with the laser light, which creates the linear scanning path, for plural times in such a manner that the scanning paths of the laser light are parallel to each other, the laser light is delivered to an entire planned laser irradiation pattern. After completion of the irradiation with the laser light, a surface (the scanning path, a path surface) defined by connecting the focus points of the laser light to each other corresponds to the predetermined pattern.

For example, the scanning path surface of the laser light constitutes a line of the line and space pattern. In addition, the line and space pattern, of which the line corresponds to the path surface of the laser light, can be obtained as follows. That is, scanning with the laser light is performed once along a predetermined direction to draw the linear scanning path surface of the laser light, and the scanning is repeated while a distance is provided between the scanning path surfaces in a direction perpendicular to the scanning direction of the laser light.

In addition to performing the scanning with the laser light within a region of the predetermined pattern as described above, the laser processing apparatus 102 can deliver the laser light including the circular cross section to each lattice point of square lattice or hound's-tooth check of the base crystal substrate.

Once the irradiation of the laser light in the entire planned laser irradiation pattern is completed, the control portion 114 finishes the emission of the laser light from the laser light source 110 and finishes the scanning of the laser light conducted by the scanning optical system 134. The scan with the laser light may be completed by the user providing an instruction to finish the scanning with the laser light via the input operation portion 138.

As described above, the laser processing apparatus according to the present embodiment delivers or irradiates the ultrashort-pulse laser light to the predetermined region of the base crystal substrate 12.

Figure 3C:
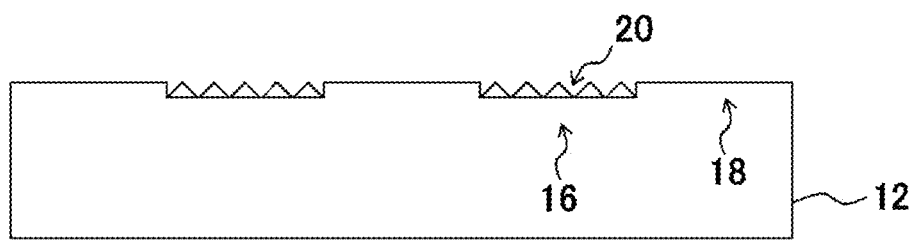
FIG. 3C is a cross-sectional view (first cross-sectional view) illustrating a process of the manufacturing method of the substrate according to the first embodiment.

After the processed portion 16 is formed at the surface of the base crystal substrate 12 with the use of the laser processing apparatus 102 illustrated in FIG. 4, foreign materials on the surface of the base crystal substrate 12 are removed by, for example, wet etching as illustrated in FIG. 3C so that the surface of the base crystal substrate 12 becomes a clean surface.

Figure 6:
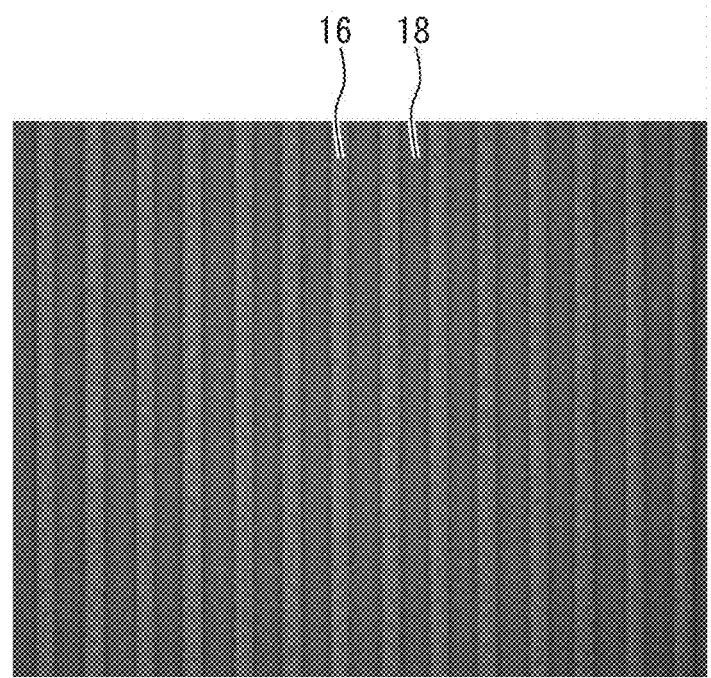
FIG. 6 is a scanning electron microscope image showing a processed portion of a surface of a SiC substrate, which is processed by irradiation with ultrashort-pulse laser light.

FIG. 6 is a scanning electron microscope image showing a surface of the SiC substrate serving as the base crystal substrate 12 before the crystal growth, which is obtained as described above. As observed in the scanning electron microscope image illustrated in FIG. 6, the processed portions 16, each of which corresponds to a relatively bright band-shaped region, are formed to be spaced at the predetermined distance. As also observed in the scanning electron microscope image illustrated in FIG. 6, a relatively dark band-shaped region between the adjacent band-shaped processed portions 16 corresponds to the unprocessed portion 18.

Figure 7:
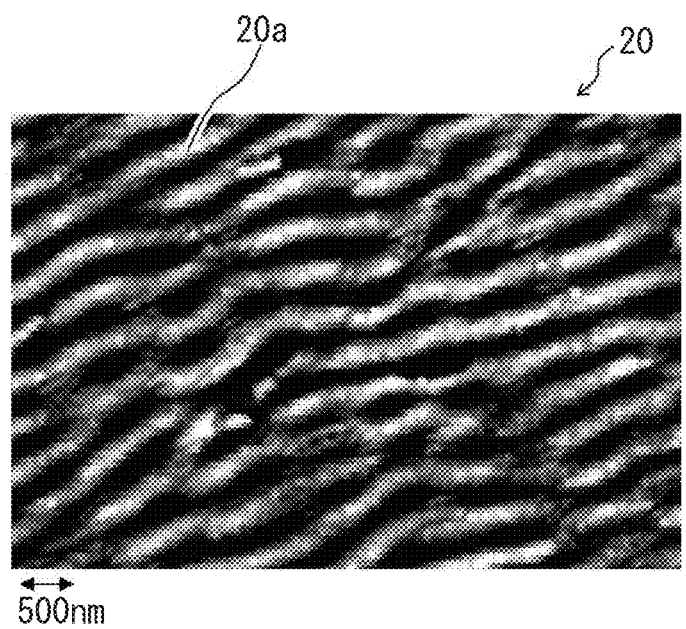
FIG. 7 is a scanning electron microscope image showing a nano periodic structure of the processed portion processed by irradiation with the ultrashort-pulse laser light.

FIG. 7 is a scanning electron microscope image showing the nano periodic structure 20 at the surface within the processed portion 16 formed at the surface of the SiC substrate serving as the base crystal substrate 12 before the crystal growth. As observed in the scanning electron microscope image illustrated in FIG. 7, a ridged structure 20a constitutes or defines the nano periodic structure 20. A width of the ridged structure 20a is several hundreds of nanometers order and the ridged structures 20a are formed in a cycle of several hundreds of nanometers order.

Each of FIGS. 8A to 8C illustrates an example of the nano periodic structure 20 of the surface within the processed portion 16 including the band-shaped planar configuration and forming the line and space pattern. In FIGS. 8A and 8B, the ridged structure constituting the nano periodic structure 20 is schematically indicated with a gray line. In FIG. 8C, a dotted structure constituting the nano periodic structure 20 is schematically indicated with a gray dot. For example, as illustrated in FIG. 8A, the ridged structures, each of which is along a width direction of the band-shaped processed portion 16, are formed to be arranged in a lengthwise direction of the processed portion 16. Alternatively, as illustrated in FIG. 8B, the ridged structures, each of which is along the lengthwise direction of the band-shaped processed portion 16, can be formed to be arranged in the width direction of the processed portion 16. Further, instead of the ridged structures, as the structures constituting the nano periodic structure 20, the dotted structures can be formed to be arranged in a substantially lattice configuration within the band-shaped processed portion 16 as illustrated in FIG. 8C.

A size and/or a cycle of the fine structure, for example, the ridged structure and the dotted structure, which appears in the nano periodic structure 20 in a cyclic or periodic manner, can be adjusted by changing processing condition by the irradiation of the ultrashort-pulse laser light. The processing condition includes the wavelength, the energy and the scanning direction of the ultrashort-pulse laser light La delivered, for example.

The fine structure forming the nano periodic structure 20 may appear in the cycle of nanometer order and at least a size of the fine structure in a direction of the cycle may be nanometer order. For example, the ridged structure constituting the nano periodic structure 20 may appear in the cycle of nanometer order in a width direction and at least a width of the ridged structure is nanometer order, and a length of the ridged structure may be micron order.

As described above, the nano periodic structure 20 is formed at the surface of the processed portion 16, and a surface state of the processed portion 16 is reformed to be different from a surface state of the unprocessed portion 18. In addition, at least a surface layer portion of the surface inside the processed portion 16 is non-crystalline rather than crystalline because the surface layer portion is irradiated with the ultrashort-pulse laser light. According to the above-described surface states, it can be considered that the processed portion 16 is in a state where no or only slight crystal growth of the semiconductor crystal layer occurs at the processed portion 16.

After the surface of the base crystal substrate 12 is made to be the clean surface, the semiconductor crystal layer 14 constituted by GaN is crystal-grown on the base crystal substrate 12 by a Metal Organic Chemical Vapor Deposition (MOCVD) method. As source materials, trimethylgallium (TMG) is used as a group III source gas and ammonia ($NH_3$) is used as a group V source gas.

Figure 9A:
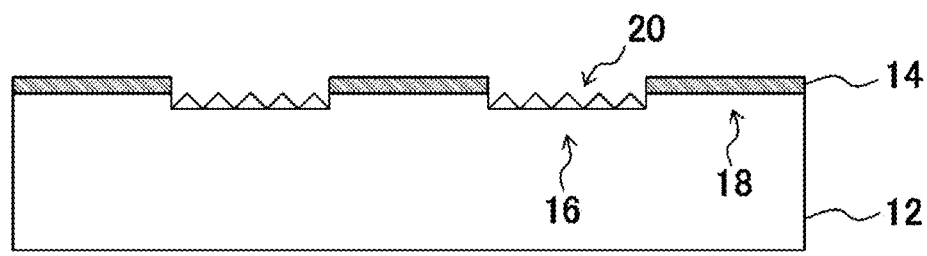
FIG. 9A is a cross-sectional view (second cross-sectional view) illustrating a process of the manufacturing method of the substrate according to the first embodiment.

As a growth condition at an early growth stage, a V/III ratio, that is, a ratio of the group V element source gas to the group III source gas is 1000, for example, and a growth temperature is 1040° C., for example. As illustrated in FIG. 9A, at the early growth stage, the semiconductor crystal layer 14 crystal grows selectively on the unprocessed portion 18 of the surface of the base crystal substrate 12 (a first crystal growth process) and the semiconductor crystal layer 14 does not crystal grow inside the processed portion 16. Thus, at the early growth stage, the semiconductor crystal layer 14 including a thickness of, for example, 200 nm to 1000 nm, is selectively grown on the unprocessed portion 18.

Figure 9B:
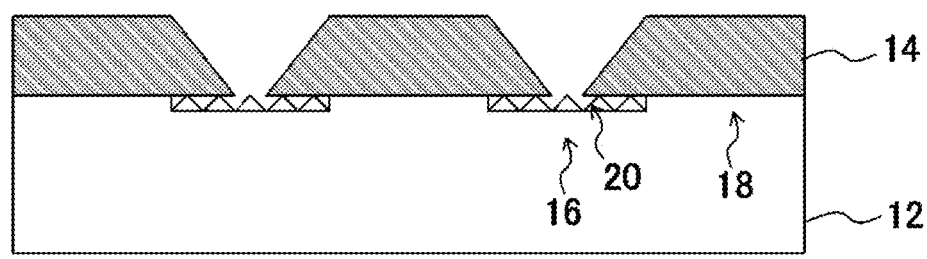
FIG. 9B is a cross-sectional view (second cross-sectional view) illustrating a process of the manufacturing method of the substrate according to the first embodiment.

Next, the growth condition of the semiconductor crystal layer 14 is changed and thus the semiconductor crystal layer 14 that has selectively grown on the unprocessed portion 18 is grown in the lateral direction (lateral growth). Specifically, among the grown conditions, the V/III ratio is changed from, for example, 1000 to, for example, 3000. The growth temperature remains at 1040° C., for example. Accordingly, the semiconductor crystal layer 14 grows in the lateral direction under a growth condition which is different from the growth condition of the early growth, and consequently, the processed portion 16 comes to be covered with the semiconductor crystal layer 14 as illustrated in FIG. 9B. Here, the growth of the semiconductor crystal layer 14 is switched from the growth in an upper direction of the base crystal substrate 12 to the growth in the lateral direction by changing the V/III ratio, however, the growth of the semiconductor crystal layer 14 can be switched to the growth in the lateral direction by changing flow volume of the source gas and/or the growth temperature, for example.

Figure 10:
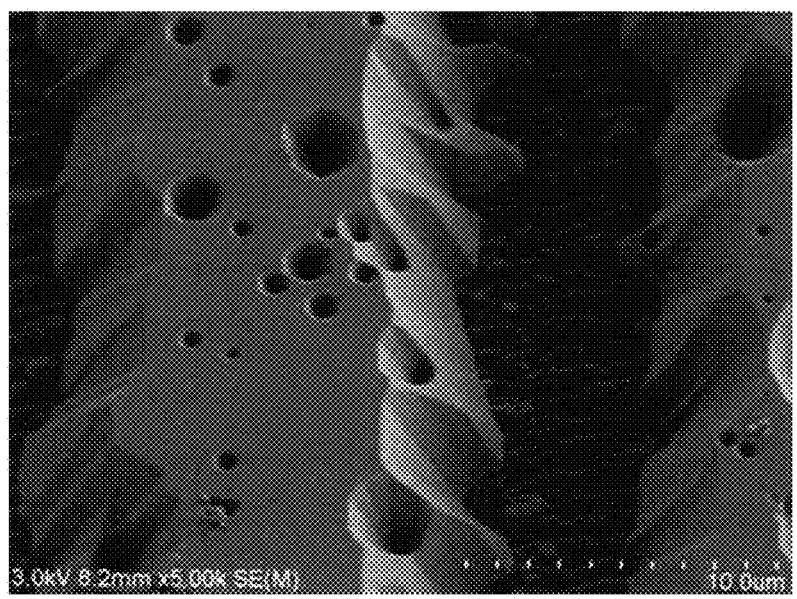
FIG. 10 is a scanning electron microscope image (first image) observing a manner in which the processed portion processed by irradiation with the ultrashort-pulse laser light is covered with a semiconductor crystal layer.

FIG. 10 is a scanning electron microscope image showing a state in which the processed portion 16 is partially covered with the semiconductor crystal layer 14 as illustrated in FIG. 9B. In the scanning electron microscope image of FIG. 10, it is observed that the semiconductor crystal layer formed from GaN is relatively bright while the processed portion formed at the SiC substrate is relatively dark, and each lateral portion of the processed portion is covered with the semiconductor crystal layer.

In the manner described above, the semiconductor crystal layer 14 is allowed to grow in the lateral direction until the processed portions 16 are substantially or almost covered with the semiconductor crystal layer 14.

Figure 9C:
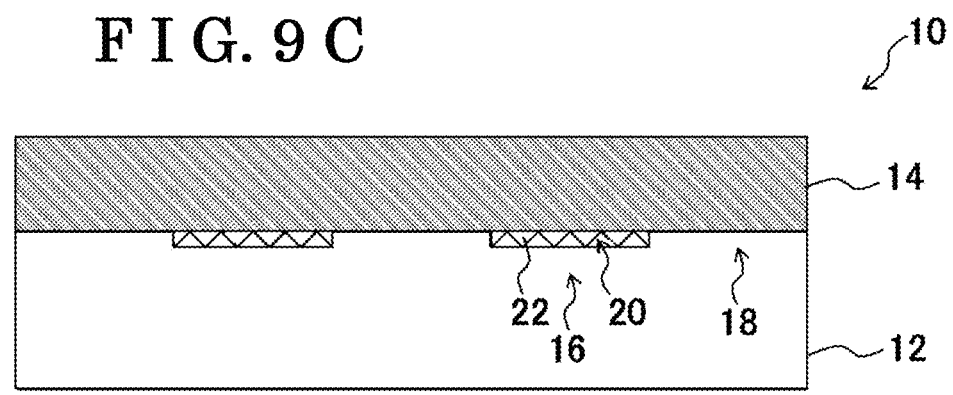
FIG. 9C is a cross-sectional view (second cross-sectional view) illustrating a process of the manufacturing method of the substrate according to the first embodiment.

Next, the direction in which semiconductor crystal layer 14 grows is switched by changing the growth condition of the semiconductor crystal layer 14 again so that the semiconductor crystal layer 14 is crystal-grown in the upper direction of the base crystal substrate 12. Specifically, among the grown conditions, the V/III ratio is changed from, for example, 3000 to, for example, 1000. The growth temperature remains at 1040° C., for example. As described above, the semiconductor crystal layer 14 is allowed to crystal-grow until the thickness of the semiconductor crystal layer 14 comes to be, for example, 2000 nm. At this time, as illustrated in FIG. 9C, the surface of the semiconductor crystal layer 14 comes to be substantially flat. In addition, the air gap 22 is generated between the semiconductor crystal layer 14 covering the processed portions 16, and the surface within each processed portion 16. Here, the growth of the semiconductor crystal layer 14 is switched from the growth in the lateral direction to the growth in the upper direction of the base crystal substrate 12 by changing the V/III ratio, however, the growth of the semiconductor crystal layer 14 can be switched to the growth in the upper direction of the base crystal substrate 12 by changing the flow volume of the source gas and/or the growth temperature, for example.

Figure 11:
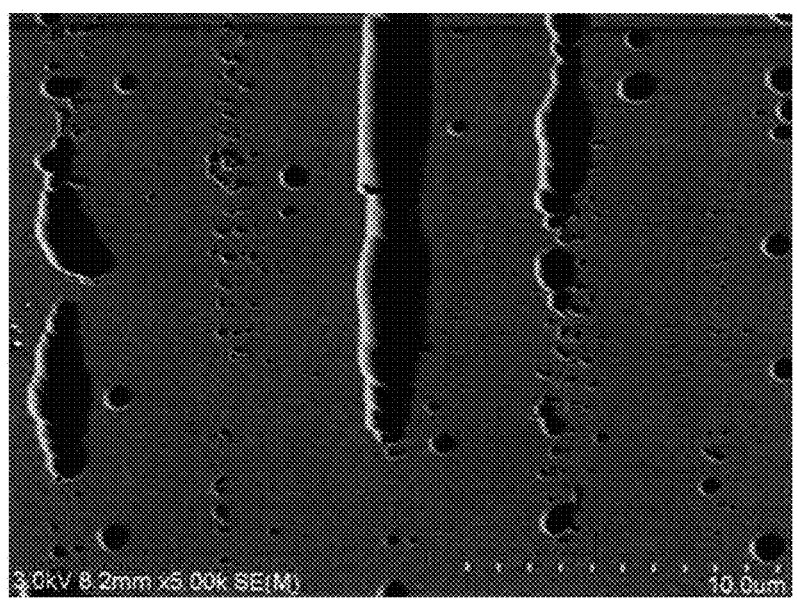
FIG. 11 is a scanning electron microscope image (second image) observing a manner in which the processed portion processed by irradiation with the ultrashort-pulse laser light is covered with the semiconductor crystal layer.

FIG. 11 is a scanning electron microscope image showing a state immediately before the processed portion 16 is fully covered with the semiconductor crystal layer 14 as illustrated in FIG. 9C. In the scanning electron microscope image of FIG. 11, it is observed that the semiconductor crystal layer formed from GaN has been crystal-grown over the entire surface and a recessed portion which is relatively dark is found in a region on the processed portion. The recessed portion is generated at a portion at which the semiconductor crystal layers, which have been crystal-grown in the lateral directions from the unprocessed portions adjacent to each other across the processed portion, are joined to each other. As the lateral growth of the semiconductor crystal layer proceeds, the recessed portion becomes flat and, eventually, the surface of the semiconductor crystal layer becomes substantially flat.

In consequence, the substrate 10, which is formed by the semiconductor crystal layer 14 crystal-grown on the base crystal substrate 12, is manufactured.

As described above, according to the manufacturing method of the substrate of the present embodiment, the processed portion 16, at which the growth of the semiconductor crystal layer 14 does not occur, is formed on the surface of the base crystal substrate 12 by the irradiation with the ultrashort-pulse laser light. Thus, according to the present embodiment, the selective growth of the semiconductor crystal layer 14 at the unprocessed portion 18 is achieved without using a selective growth mask made of, for example, a silicone oxide film. There is no need to use the selective growth mask according to the present embodiment, and therefore a process of forming a film, a lithography process and an etching process for making the selective growth mask are not necessary. As a result, according to the present embodiment, the selective growth of the semiconductor crystal layer 14 can be easily achieved without increasing the number of processes.

In addition, the selective growth mask is not used in the present embodiment, and thus material of the selective growth mask does not diffuse at the semiconductor crystal layer 14 crystal-grown on the base crystal substrate 12. Thus, according to the present embodiment, autodoping of the impurity substance relative to the semiconductor crystal layer 14 is avoided. Accordingly, in a case where the semiconductor device is manufactured by using the substrate 10 according to the present embodiment, the semiconductor device including an appropriate or excellent device characteristic is manufactured.

In addition, the nano periodic structure 20 is formed at the surface of the processed portion 16, and the surface state of the processed portion 16 is reformed to be different from the surface state of the unprocessed portion 18. Thus, according to the present embodiment, unlike a recess/protrusion surface structure formed by, for example, a known RIE, the semiconductor crystal layer 14 can be restrained from crystal-growing at the processed portion 16 even in a case where the step of the processed portion 16 is relatively shallow. In addition, in a case where the base crystal substrate 12 at which the processed portion 16 including the nano periodic structure 20 is formed, the occurrence of the abnormal growth may be reduced without restricting the growth condition for achieving the selective growth. Consequently, according to the present embodiment, the semiconductor crystal layer 14 having the appropriate quality can be crystal-grown in the reliable manner. In the crystal-grown semiconductor crystal layer 14, the defect and/or distortion is restrained and the abnormal growth is reduced.

The processed portion 16 does not need to include the stepped configuration. The surface of the processed portion 16 may be formed with the nano periodic structure 20 and the surface state of the processed portion 16 may be reformed to be different from the surface state of the unprocessed portion 18. Also in this case, the processed portion 16 can reliably restrain the crystal-growth of the semiconductor crystal layer 14.

Figure 12A:
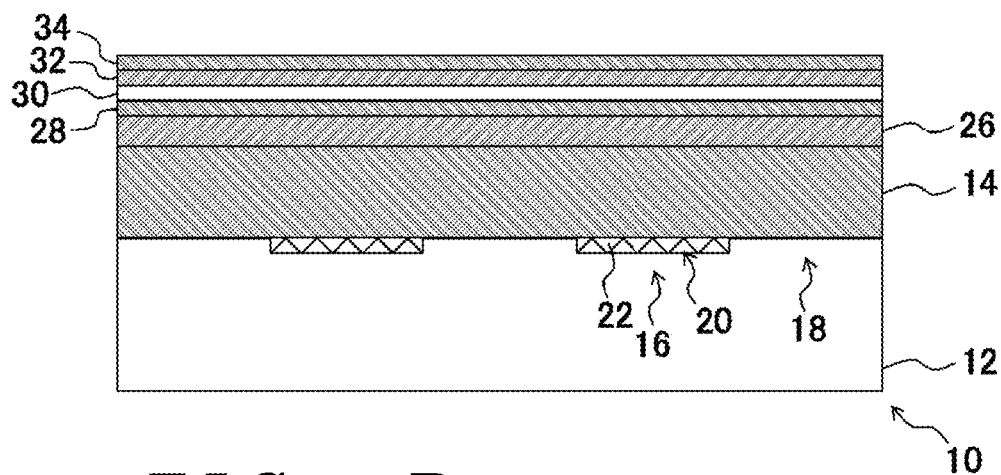
FIG. 12A is a cross-sectional view illustrating a process of a manufacturing method of a semiconductor device according to the first embodiment disclosed here.
Figure 12B:
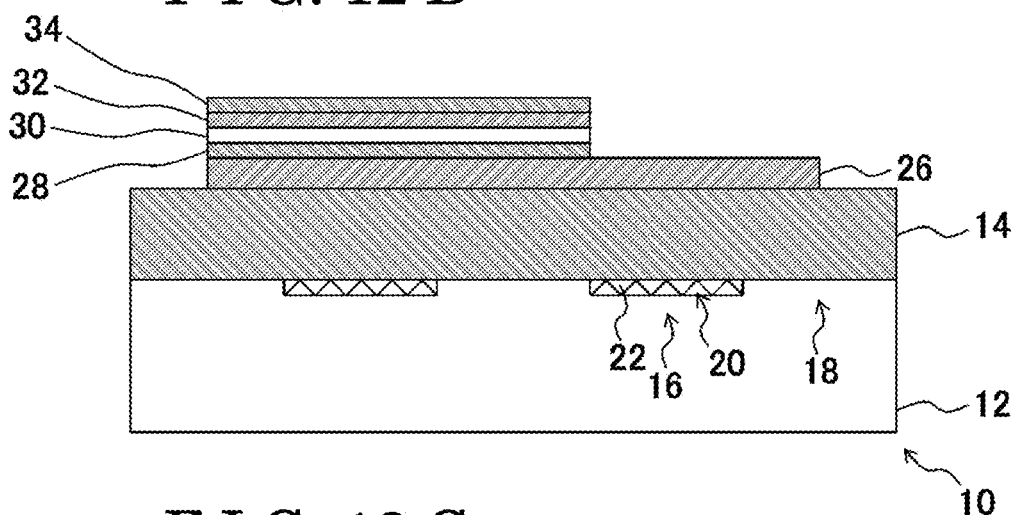
FIG. 12B is a cross-sectional view illustrating a process of the manufacturing method of the semiconductor device according to the first embodiment.
Figure 12C:
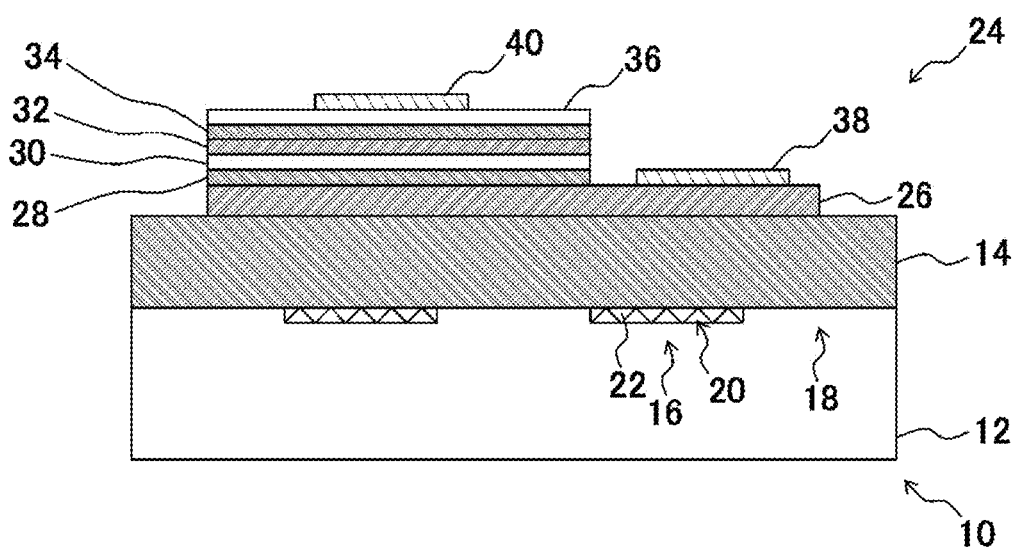
FIG. 12C is a cross-sectional view illustrating a process of the manufacturing method of the semiconductor device according to the first embodiment.

The semiconductor device can be manufactured by using the substrate 10 manufactured as described above. The manufacturing method of the semiconductor device according to the present embodiment will be described below with reference to FIGS. 12A to 12C. Each of FIGS. 12A to 12C is a cross-sectional view illustrating a process of the manufacturing method of the semiconductor device according to the present embodiment.

First, the n type contact layer 26 which is formed from the n type GaN and of which the thickness is, for example, 3000 nm is grown on the semiconductor crystal layer 14 of the substrate 10 by the MOCVD method. At this time, the n type contact layer 26 is doped with Si serving as the impurity substance at a concentration of, for example, $4\times10^{18}$ cm$^{-3}$.

Next, the n type clad layer 28 of which a thickness is, for example, 200 nm and which is formed from the n type AlGaN is formed on the n type contact layer 26 by the MOCVD method. At this time, the n type clad layer 28 is doped with Si serving as the impurity substance at a concentration of, for example, $1\times10^{18}$ cm$^{-3}$.

At the semiconductor crystal layer 14, a grain boundary is generated at the portion at which the semiconductor crystal layers grown in the lateral direction are joined to each other. Thus, before the n type contact layer 26 is grown, a buffer layer for reducing influences of defects including the grain boundary at the semiconductor crystal layer 14 may be grown on the semiconductor crystal layer 14, and then the n type contact layer 26 may be grown on the buffer layer. Accordingly, the influences of the defects at the semiconductor crystal layer 14 can be reduced.

Next, the three barrier layers each formed from the non-doped GaN and including a thickness of, for example, 4 nm and the three well layers each formed from the non-doped $In_{0.3}Ga_{0.7}N$ and including a thickness of, for example, 3 nm are grown on the n type clad layer 28 by the MOCVD method in such a manner that the barrier layers and the well layers are alternately layered on one another and that the barrier layer is grown on the topmost layer. Thus, the multiple quantum well layer 30, where the barrier layers and the well layers are layered alternately with one another, is formed on the n type clad layer 28.

Next, the p type clad layer 32 which is formed from the p type AlGaN and of which a thickness is, for example, 100 nm is grown on the multiple quantum well layer 30 by the MOCVD method. At this time, the p type clad layer 32 is doped with Mg serving as the impurity substance at a concentration of, for example, $5\times10^{18}$ cm$^{-3}$.

Next, the p type contact layer 34 which is formed from p type GaN and of which a thickness is, for example, 500 nm is grown on the p type clad layer 32 by the MOCVD method. The p type contact layer 34 is doped with Mg serving as the impurity substance at a concentration of, for example, $5\times10^{19}$ cm$^{-3}$.

In consequence, as illustrated in FIG. 12A, the n type contact layer 26, the n type clad layer 28, the multiple quantum well layer 30, the p type clad layer 32 and the p type contact layer 34 are sequentially layered on the semiconductor crystal layer 14. As described above, the defect and/or distortion are reduced and the abnormal growth is restrained at the semiconductor crystal layer 14, and thus the semiconductor crystal layer 14 serving as the base includes the appropriate or good quality. Consequently, in the present embodiment, the n type contact layer 26, the n type clad layer 28, the multiple quantum well layer 30, the p type clad layer 32 and the p type contact layer 34 are formed to include appropriate or good qualities. As a result, according to the present embodiment, the semiconductor device 24 including the excellent device characteristic and a high performance is manufactured.

Next, the patterning is performed to the n type contact layer 26, the n type clad layer 28, the multiple quantum well layer 30, the p type clad layer 32 and the p type contact layer 34 into predetermined shapes or configurations. Subsequently, as illustrated in FIG. 12B, a groove is formed at the n type clad layer 28, the multiple quantum well layer 30, the p type clad layer 32 and the p type contact layer 34 so that device isolation is performed.

Next, a transparent conductive oxide film of, for example, ITO is formed at an entire surface of the p type contact layer 34, and thereafter patterning is applied to the transparent conductive oxide film by photolithography and etching. Thus, the transparent electrode 36 formed from the transparent conductive oxide is formed on the p type contact layer 34.

Next, the n type electrode 38 is formed by a lift-off method in the region of the n type contact layer 26 in which the n type clad layer 28 is not formed. The n type electrode 38 is formed from the Ti film and the Al film which are sequentially layered on each other. In addition, the p type electrode 40 is formed on the transparent electrode 36 by the lift-off method. The p type electrode 40 is formed from the Ni film and the Au film which are sequentially layered on each other. The n type electrode 38 and the p type electrode 40 may be formed by an evaporation method using a mask.

In consequence, the transparent electrode 36, the n type electrode 38 and the p type electrode 40 are formed as illustrated in FIG. 12C.

Thereafter, for example, protective film protecting the surface is formed and dicing or die cutting is performed to obtain chips, and accordingly the semiconductor device 24 according to the present embodiment is manufactured.

According to the semiconductor device 24 of the present embodiment which is manufactured as described above, the processed portion 16 constituting the periodic pattern, which corresponds to the line and space pattern, is formed at the surface of the base crystal substrate 12. Further, the nano periodic structure 20 is formed at the surface within the processed portion 16. In a case where light emitted at the multiple quantum well layer 30 of the semiconductor device 24 is extracted from a side of the base crystal substrate 12, the light is scattered by the processed portion 16 forming the periodic pattern and by the nano periodic structure 20 within the processed portion 16, and in consequence, total reflection of the light is restrained from occurring at the surface of the base crystal substrate 12. As a result, according to the present embodiment, a light-extraction efficiency from the side of the base crystal substrate 12 is enhanced at the semiconductor device 24.

Specifically, in a case where the semiconductor crystal layer 14 formed from GaN is crystal-grown on the base crystal substrate 12 formed by the SiC substrate, a refractive index of the semiconductor crystal layer 14 and a refractive index of the base crystal substrate 12 are close to each other. Thus, if the light is allowed to pass through an interface between the semiconductor crystal layer 14 and the base crystal substrate 12, and is extracted as is, it is difficult to restrain the total reflection from occurring at the interface. To the contrary, according to the present embodiment, the air gap 22 due to the processed portion 16 exists between the base crystal substrate 12 and the semiconductor crystal layer 14. The air gap 22 is filled with the air including a refractive index that is smaller than the refractive indexes of the base crystal substrate 12 and the semiconductor crystal layer 14. Because the medium including the relatively small refractive index is present in the air gap 22, the light is refracted and scattered more easily compared to a case where the air gap 22 is absent, and therefore a higher light-extraction efficiency is obtained.

A substrate and a manufacturing method thereof, and a semiconductor device and a manufacturing method thereof according to a second embodiment disclosed here will be described with reference to FIGS. 13 to 18B. The same reference numerals designate the same or corresponding components of the substrate and the manufacturing method thereof, and the semiconductor device and the manufacturing method thereof according to the first embodiment, and the description thereof will be omitted or simplified.

Figure 13:
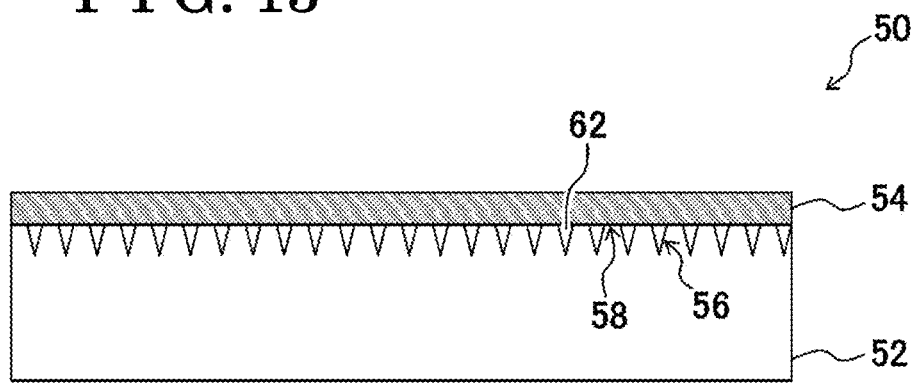
FIG. 13 is a cross-sectional view illustrating a substrate according to a second embodiment disclosed here.

First, the substrate according to the present embodiment will be described with reference to FIG. 13. FIG. 13 is a cross-sectional view illustrating the substrate according to the present embodiment.

As illustrated in FIG. 13, a substrate 50 of the present embodiment includes a base crystal substrate 52 (i.e., the base substrate) formed from a sapphire substrate that is insulating and a semiconductor crystal layer 54 formed from GaN that is crystal-grown on the base crystal substrate 52.

A processed portion 56 processed by irradiation with the ultrashort-pulse laser light is formed at a surface of the base crystal substrate 52. Other region of the surface of the base crystal substrate 52 than the processed portion 56 is an unprocessed portion 58 that has not been irradiated with the ultrashort-pulse laser light.

The processed portion 56 includes a conical recessed portion of which a depth is approximately 0.5 µm to 5 µm, for example. Plural processed portions 56 are formed at the surface of the base crystal substrate 52 to be arranged in a lattice configuration spaced at a predetermined interval. Diameter of the processed portion 56 of the surface of the base crystal substrate 52 is 0.5 µm to 5 µm, for example. The width of the unprocessed portion 58 arranged between the adjacent processed portions 56 is also 0.5 µm to 5 µm, for example. Accordingly, a lattice pattern, which serves as the periodic pattern, is formed or configured from the plural processed portions 56 at the surface of the base crystal substrate 52.

A nano periodic structure 60 (refer to FIGS. 17A and 17B) is formed at a surface within or inside each processed portion 56. The nano periodic structure 60 is the periodic protrusion/recess structure including the cycle of nanometer order. The nano periodic structure 60 inside the processed portion 56 is formed due to the above-described phenomenon in which the abrasion is generated by the irradiation of the ultrashort-pulse laser light in a cycle that is close to the wavelength of the ultrashort-pulse laser light.

The semiconductor crystal layer 54, which is formed from GaN and of which a thickness is, for example, 3000 nm, is crystal-grown on the base crystal substrate 52 including thereon the processed portions 56. The semiconductor crystal layer 54 is crystal-grown on the base crystal substrate 52 from the unprocessed portion 58 of the base crystal substrate 52 and is crystal-grown in the lateral direction to cover the processed portion 56. A surface of the semiconductor crystal layer 54 is substantially flat.

The semiconductor crystal layer 54 covering the processed portion 56 does not fill in the processed portion 56 corresponding to the conical recessed portion. Thus, an air gap 62, that is, a void, is generated between the semiconductor crystal layer 54 covering the processed portion 56, and an inner wall surface of the processed portion 56.

In consequence, the substrate 50 of the present embodiment is configured as described above. According to the substrate 50 of the present embodiment, the semiconductor crystal layer 54 is crystal-grown on the base crystal substrate 52. The base crystal substrate 52 includes the processed portions 56 processed by the irradiation with the ultrashort-pulse laser light. Thus, as will be described below, the semiconductor crystal layer 54 includes the appropriate quality while the defect, and/or distortion or deformation is reduced and the abnormal growth is restrained from occurring in a similar manner to the semiconductor crystal layer 14 of the first embodiment.

Next, the semiconductor device according to the present embodiment in which the substrate 50 illustrated in FIG. 13 is used will be described with reference to FIG. 14. A device structure of a semiconductor device 64 of the present embodiment is formed on the semiconductor crystal layer 54 of the substrate 50. Specifically, the semiconductor device 64 is light emitting diode (LED) that is one of the light emitting devices.

Figure 14:
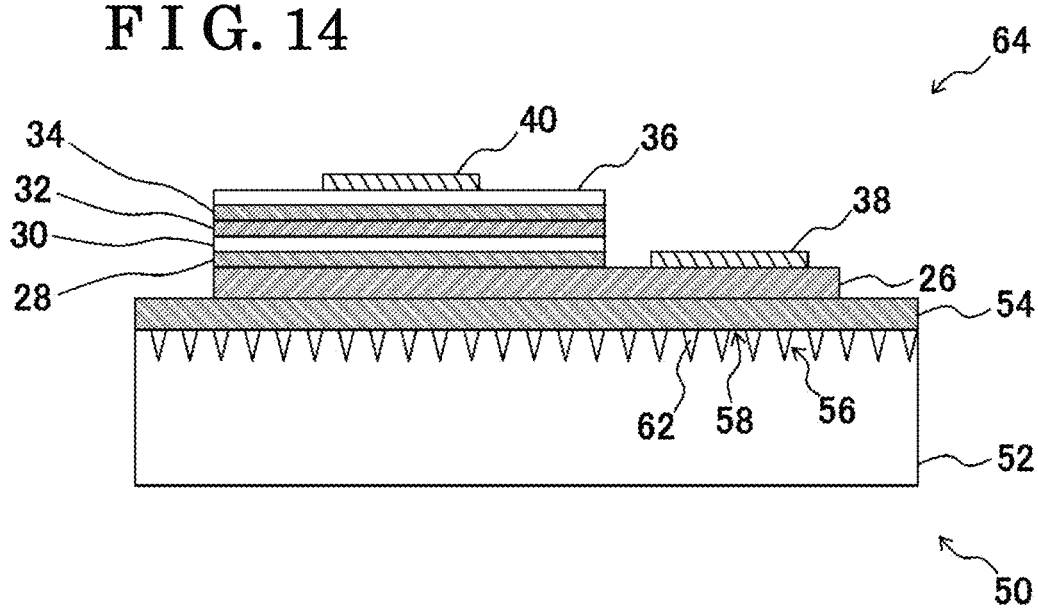
FIG. 14 is a cross-sectional view illustrating a semiconductor device according to the second embodiment.

As illustrated in FIG. 14, the n type contact layer 26, the n type clad layer 28, the multiple quantum well layer 30, the p type clad layer 32 and the p type contact layer 34 are sequentially formed on the semiconductor crystal layer 54 of the substrate 50 in a similar manner to the first embodiment.

The transparent electrode 36 is formed on the p type contact layer 34 in a similar manner to the first embodiment. In a similar manner to the first embodiment, the n type electrode 38 is formed in the region of the n type contact layer 26 in which the n type clad layer 28 is not formed. In addition, the p type electrode 40 is formed on the transparent electrode 36 in a similar manner to the first embodiment.

Accordingly, the semiconductor device 64, which uses the substrate 50, of the present embodiment is configured as described above. According to the semiconductor device 64 of the present embodiment, the n type contact layer 26, the n type clad layer 28, the multiple quantum well layer 30, the p type clad layer 32 and the p type contact layer 34 which constitute the device structure are formed on the semiconductor crystal layer 54 including the high quality. Thus, according to the semiconductor device 64 of the present embodiment, also the n type contact layer 26, the n type clad layer 28, the multiple quantum well layer 30, the p type clad layer 32 and the p type contact layer 34 include the high qualities. Consequently, the appropriate or excellent device characteristic is achieved according to the semiconductor device 64 of the present embodiment.

Next, the manufacturing method of the substrate according to the present embodiment will be described with reference to FIGS. 15A to 18B.

Figure 15A:
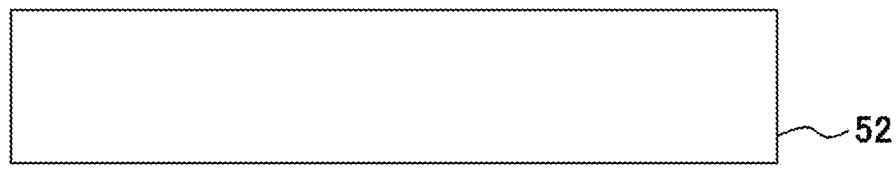
FIG. 15A is a cross-sectional view (first cross-sectional view) illustrating a process of a manufacturing method of a substrate according to the second embodiment.

First, as illustrated in FIG. 15A, the base crystal substrate 52 formed from the insulating sapphire substrate is prepared as the base crystal substrate 52 on which the semiconductor crystal layer 54 is to be crystal-grown.

Figure 15B:
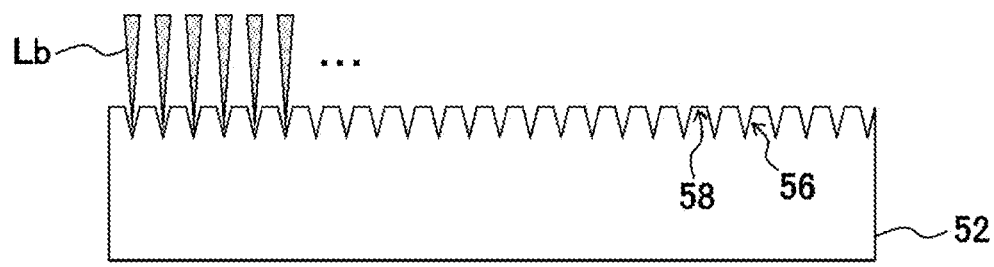
FIG. 15B is a cross-sectional view (first cross-sectional view) illustrating a process of the manufacturing method of the substrate according to the second embodiment.

Next, as illustrated in FIG. 15B, the surface of the base crystal substrate 52 is irradiated with an ultrashort-pulse laser Lb and thus the plural processed portions 56 are formed at the surface of the base crystal substrate 52. The laser processing apparatus illustrated in FIG. 4 may be used for the irradiation of the ultrashort-pulse laser Lb. In the irradiation of the ultrashort-pulse laser Lb, the ultrashort-pulse laser Lb including the circular cross-sectional shape is delivered to each lattice point of the square lattice or the hound's-tooth check of the surface of the base crystal substrate 52. The conical recessed portion serving as the processed portion 56 is formed by the above-described irradiation with the ultrashort-pulse laser Lb. In addition, the lattice pattern is formed by the plural processed portions 56 at the surface of the base crystal substrate 52. In addition, the nano periodic structure 60 (refer to FIGS. 17A and 17B) is formed at the surface inside each of the processed portions 56 by the abrasion caused by the irradiation with the ultrashort-pulse laser light.

Figure 16A:
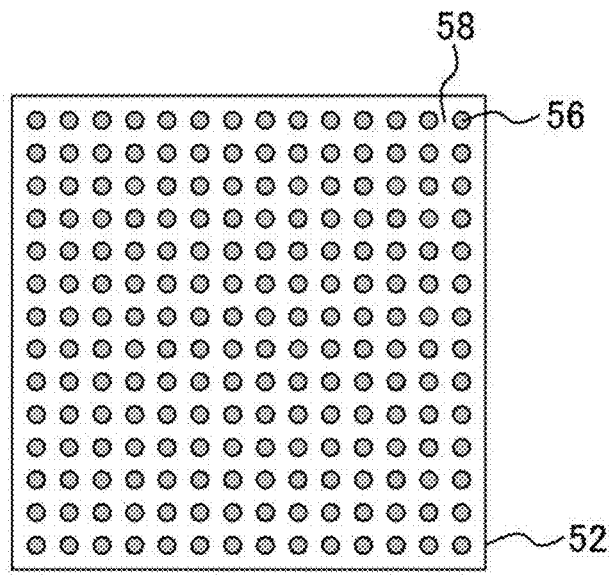
FIG. 16A is a plan view illustrating an example of a lattice pattern by plural processed portions.
Figure 16B:
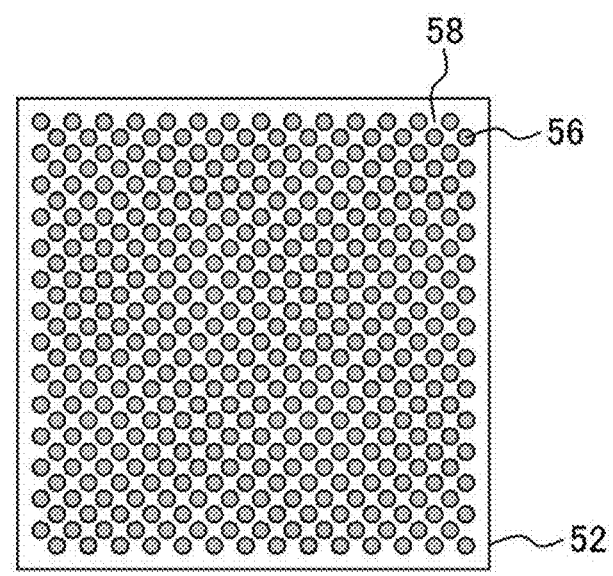
FIG. 16B is a plan view illustrating an example of the lattice pattern by the plural processed portions.

FIGS. 16A and 16B each illustrates an example of the lattice pattern formed by the plural processed portions 56. As illustrated in FIG. 16A, the plural processed portion 56 may be formed to be arranged in the square lattice configuration. Alternatively, as illustrated in FIG. 16B, the plural processed portion 56 may be formed to be arranged in the hound's-tooth check.

The processed portion 56 is not limited to the conical recessed portion and may be formed in various shapes or configurations. By appropriately changing irradiation conditions of the ultrashort-pulse laser light such as the cross-sectional shape, the output and irradiation time period of the ultrashort-pulse laser light, a recessed portion including a circular column shape, a circular truncated conical shape, a rectangular column shape or a truncated pyramid shape can be formed as the processed portion 56.

Figure 15C:
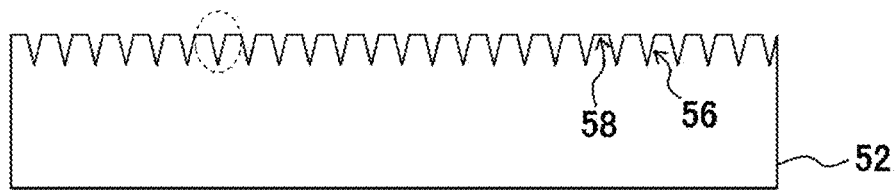
FIG. 15C is a cross-sectional view (first cross-sectional view) illustrating a process of the manufacturing method of the substrate according to the second embodiment.

After the processed portion 56 is formed at the surface of the base crystal substrate 52 as described above, the foreign materials on the surface of the base crystal substrate 52 are removed by, for example, wet etching as illustrated in FIG. 15C so that the surface of the base crystal substrate 52 becomes the clean surface.

Figure 17A:
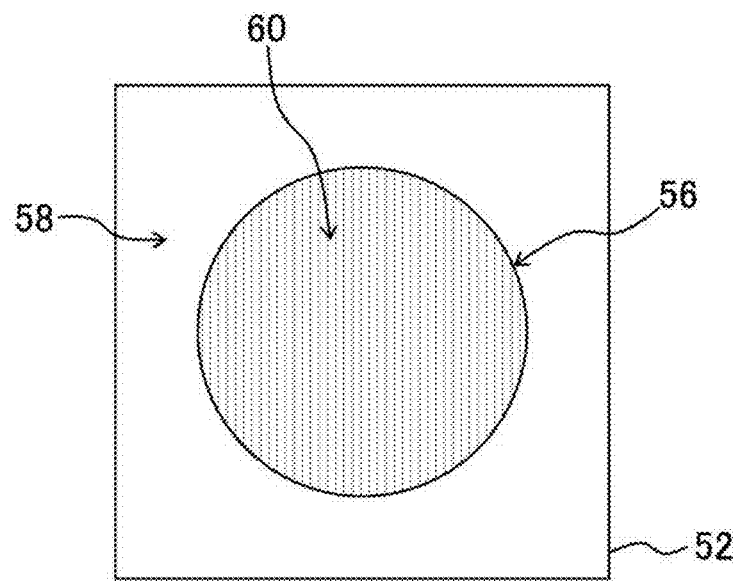
FIG. 17A is a schematic view illustrating a nano periodic structure of a processed portion corresponding to a conical recessed portion.
Figure 17B:
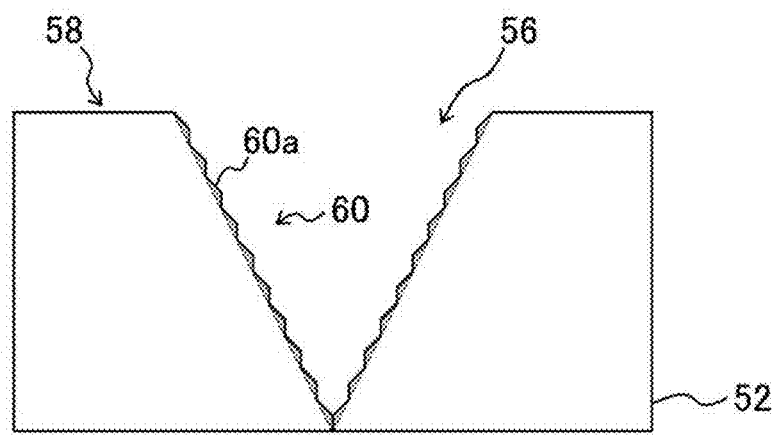
FIG. 17B is a schematic view illustrating the nano periodic structure of the processed portion corresponding to the conical recessed portion.

FIG. 17 is a schematic view illustrating the processed portion 56 of the base crystal substrate 52 before the crystal growth, which is obtained as described above. FIG. 17A is a plan view illustrating the processed portion 56. FIG. 17B is an enlarged cross-sectional view illustrating the processed portion 56, which corresponds to the cross section encircled by the oval indicated by the dotted line in FIG. 15C. In FIG. 17A, a ridged structure 60a is schematically indicated with a gray line. As illustrated in FIGS. 17A and 17B, at the inner wall surface of the processed portion 56 that is the conical recessed portion, the ridged structures 60a constitute or define the nano periodic structure 60. A width of each ridged structure 60a is several hundreds of nanometers order, for example, and the ridged structures 60a are formed in a cycle of several hundreds of nanometers order, for example.

A size and/or a cycle of the structure including the ridged structure 60a appearing in the nano periodic structure 60 in a cyclic or periodical manner can be adjusted by changing the processing conditions by the irradiation of the ultrashort-pulse laser light. The processing conditions include the wavelength, the energy and the scanning direction of the ultrashort-pulse laser light Lb that is irradiated, for example. In addition, by changing the processing conditions appropriately, other fine structure instead of the ridged structure 60a can appear in the nano periodic structure 60 at the processed portion 56. For example, a dotted structure of which a size is several hundreds of nanometers order may appear in a substantially lattice configuration at a cycle of several hundreds of nanometers order, for example.

After the surface of the base crystal substrate 52 is made clean, the semiconductor crystal layer 54 formed from GaN is crystal-grown on the base crystal substrate 52 by the MOCVD method. As the source materials, the TMG is used as the group III source gas and $NH_3$ is used as the group V source gas.

Figure 18A:
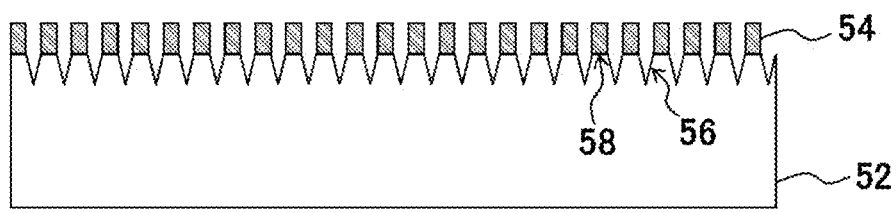
FIG. 18A is a cross-sectional view (second cross-sectional view) illustrating the process of the manufacturing method of the substrate according to the second embodiment.

As the growth condition at the early growth stage, the V/III ratio is 1000, for example, and the growth temperature is 1040° C., for example. As illustrated in FIG. 18A, at the early growth stage, the semiconductor crystal layer 54 crystal grows selectively on the unprocessed portion 58 of the surface of the base crystal substrate 52 but the semiconductor crystal layer 54 does not crystal-grow inside the processed portion 56. Thus, the semiconductor crystal layer 54 including a thickness of, for example, 200 nm to 1000 nm, is selectively grown on the unprocessed portion 58.

Figure 18B:
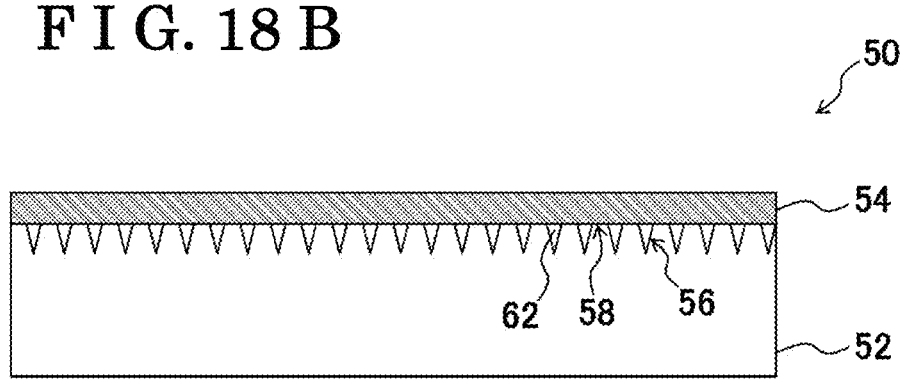
FIG. 18B is a cross-sectional view (second cross-sectional view) illustrating the process of the manufacturing method of the substrate according to the second embodiment.

Next, the growth condition of the semiconductor crystal layer 54 is changed and thus the semiconductor crystal layer 54 that has selectively grown on the unprocessed portion 58 is grown in the lateral direction (lateral growth). Specifically, among the grown conditions, the V/III ratio is changed from, for example, 1000 to, for example, 3000. The growth temperature remains at 1040° C., for example. Accordingly, the semiconductor crystal layer 54 grows in the lateral direction under the growth condition that is different from the growth condition of the early growth, and consequently, the processed portion 56 comes to be covered with the semiconductor crystal layer 54 as illustrated in FIG. 18B. Here, the growth of the semiconductor crystal layer 54 is switched from the growth in an upper direction of the base crystal substrate 52 to the growth in the lateral direction of the base crystal substrate 52 by changing the V/III ratio, however, the growth of the semiconductor crystal layer 54 can be switched to the growth in the lateral direction by changing the flow volume of the source gas and/or the growth temperature, for example.

The semiconductor crystal layer 54 is grown in the lateral direction until the processed portions 56 are substantially or almost covered with the semiconductor crystal layer 54. The surface of the semiconductor crystal layer 54 comes to be substantially flat. In addition, the air gap 62 is generated between the semiconductor crystal layer 54 covering the processed portion 56, and the inner wall surface of each processed portion 56. After this, the direction in which semiconductor crystal layer 54 grows may be switched by changing the growth condition of the semiconductor crystal layer 54, including the V/III ratio, the flow volume of the source gas and/or the growth temperature again, so that the semiconductor crystal layer 54 is grown in the upper direction of the base crystal substrate 52.

In consequence, the substrate 50, which is formed from the semiconductor crystal layer 54 that is crystal-grown on the base crystal substrate 52, is manufactured.

As described above, according to the manufacturing method of the substrate of the present embodiment, the processed portion 56, at which the semiconductor crystal layer 54 is prevented from growing, is formed on the surface of the base crystal substrate 52 by the irradiation with the ultrashort-pulse laser light. Thus, in a similar manner to the first embodiment, the selective growth of the semiconductor crystal layer 54 at the unprocessed portion 58 is achieved easily without increasing the number of processes or without using the selective growth mask according to the present embodiment.

In addition, the selective growth mask is not used in the present embodiment, and thus the autodoping of impurity substance relative to the semiconductor crystal layer 54 is avoided in a similar manner to the first embodiment. Accordingly, the semiconductor device including the excellent device characteristic is manufactured.

In addition, in a similar manner to the processed portion 16 of the first embodiment, unlike a recess/protrusion surface structure formed by, for example, a known RIE, the processed portion 56 including therein the nano periodic structure 60 can restrain the growth of the semiconductor crystal layer 54. In addition, in a case of the base crystal substrate 52 at which the processed portion 56 including the nano periodic structure 60 is formed, the abnormal growth is restrained from occurring without restricting the growth condition that is for achieving the selective growth. Consequently, according to the present embodiment, the semiconductor crystal layer 54 where the defect, and/or distortion or deformation is reduced and the abnormal growth is restricted from occurring is grown in the reliable manner in a similar way to the first embodiment.

The semiconductor device 64 illustrated in FIG. 14 may be manufactured on the semiconductor crystal layer 54 of the substrate 50 in a similar manner to the manufacturing method of the semiconductor device according to the first embodiment which is illustrated in FIGS. 12A to 12C. According to the semiconductor device 64 of the present embodiment which is manufactured as described above, the processed portion 56 forming the periodic pattern corresponding to the lattice pattern is formed at the surface of the base crystal substrate 52. Further, the nano periodic structure 60 is formed at the surface within the processed portion 56. In a case where the light emitted at the multiple quantum well layer 30 of the semiconductor device 64 corresponding to the LED is extracted from a side of the base crystal substrate 52, the total reflection of the light at the surface of the base crystal substrate 52 can be restrained from occurring due to the processed portion 56 forming the periodic pattern and due to the nano periodic structure 60 within the processed portion 56. As a result, according to the present embodiment, at the semiconductor device 64, the light-extraction efficiency of the light from the side of the base crystal substrate 52 is enhanced.

According to the present embodiment, the air gap 62 due to the processed portion 56 is present. The air gap 62 is filled with the air including the refractive index that is smaller than the refractive indexes of the base crystal substrate 52 and the semiconductor crystal layer 54. Thus, because the medium including the relatively small refractive index exists in the air gap 62, the light is scattered more easily compared to a case where the air gap 62 is absent, and therefore a higher light-extraction efficiency is obtained.

A manufacturing method of a semiconductor device according to a third embodiment disclosed here will be described with reference to FIGS. 19 to 21D. The same reference numerals designate the same or corresponding components of the substrate and the manufacturing method thereof, and the semiconductor device and the manufacturing method thereof according to the first and second embodiments, and the description thereof will be omitted or simplified.

Figure 19:
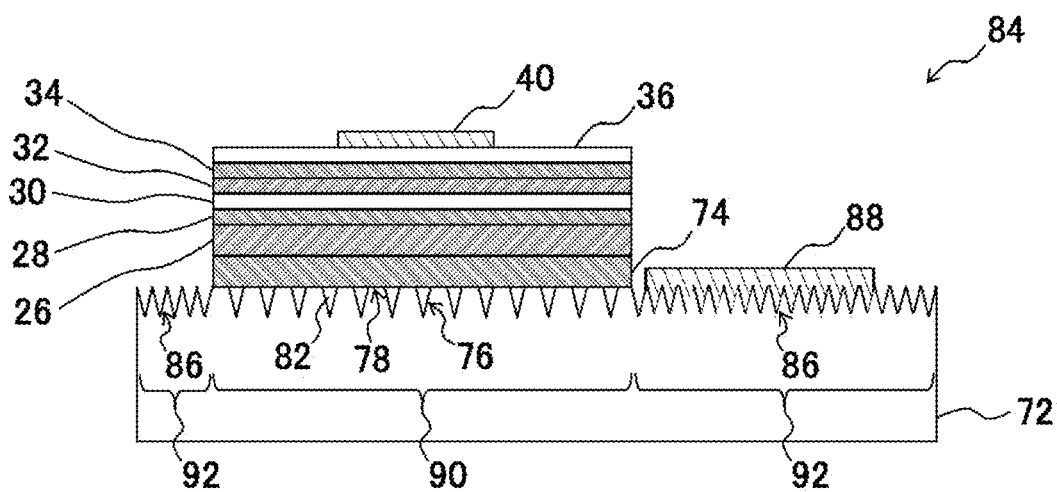
FIG. 19 is a cross-sectional view illustrating a semiconductor device according to a third embodiment disclosed here.

First, the semiconductor device according to the present embodiment will be described with reference to FIG. 19. FIG. 19 is a cross-sectional view illustrating the semiconductor device according to the present embodiment. Similarly to the first and second embodiments, the semiconductor device according to the present embodiment is LED that is one of the light emitting devices.

As illustrated in FIG. 19, a surface of a base crystal substrate 72 (i.e., the base substrate) formed from the n type conductive 6H-SiC substrate is provided with a crystal growth region 90 (i.e., a first region) and a crystal non-growth region 92 (i.e., a second region). The crystal growth region 90 is a region in which the semiconductor crystal layer forming the LED is to be crystal-grown. The crystal non-growth region 92 is a region in which the semiconductor crystal layer forming the LED is not crystal-grown.

In the crystal growth region 90, plural processed portions 76 processed by the irradiation with the ultrashort-pulse laser light are formed to be arranged in a lattice configuration. The processed portions 76 are similar to the processed portions 56 in the second embodiment, and each processed portion 76 includes the conical recessed portion. A portion between the adjacent processed portions 76 is an unprocessed portion 78 that has not been irradiated with the ultrashort-pulse laser light.

In the crystal non-growth region 92, plural processed portions 86 processed by the irradiation with the ultrashort-pulse laser light are formed to be arranged in the lattice configuration. The processed portions 86 at the crystal non-growth region 92 are similar to the processed portions 76 of the crystal growth region 90, and each processed portion 86 includes a conical recessed portion.

However, the processed portions 86 of the crystal non-growth region 92 are formed and arranged with substantially no clearance therebetween with a higher density compared to the processed portions 76 of the crystal growth region 90. Thus, at the crystal non-growth region 92, an unprocessed portion that has not been irradiated with the ultrashort-pulse laser light is not substantially present between the adjacent processed portions 86. Because the processed portions 86 are arranged with the relatively high density while substantially no clearance is provided therebetween so that the unprocessed portion does not substantially exist therebetween, the crystal non-growth region 92 is in a state, over an entire surface thereof, where the crystal growth of the semiconductor crystal layer does not occur.

A semiconductor crystal layer 74 which is formed from GaN and of which a thickness is, for example, 2000 nm is crystal-grown in the crystal growth region 90 at the surface of the base crystal substrate 72. The semiconductor crystal layer 74 is crystal-grown on the base crystal substrate 72 from the unprocessed portion 78 of the base crystal substrate 72 and is crystal-grown in the lateral direction to cover the processed portion 76. A surface of the semiconductor crystal layer 74 is substantially flat. A conductivity type of the semiconductor crystal layer 74 is n type. Conductivity between the semiconductor crystal layer 74 and an n type electrode 88, which will be described below, is ensured via the base crystal substrate 72.

The semiconductor crystal layer 74 covering the processed portion 76 does not fill in the processed portion 76 corresponding to the conical recessed portion. Thus, an air gap 82, that is, a void, is generated between the semiconductor crystal layer 74 covering the processed portion 76, and an inner wall surface of the processed portion 76.

The n type contact layer 26, the n type clad layer 28, the multiple quantum well layer 30, the p type clad layer 32 and the p type contact layer 34 are sequentially layered on the semiconductor crystal layer 74.

The transparent electrode 36 is formed on the p type contact layer 34. The p type electrode 40 is formed on the transparent electrode 36.

The n type electrode 88 formed from a metal film is formed directly at the surface of the base crystal substrate 72 in the crystal non-growth region 92. Throughout a predetermined region in which plural processed portion 86 are formed, the n type electrode 88 is formed to fill in the processed portions 86.

In consequence, a semiconductor device 84 according to the present embodiment is configured as described above.

Next, the manufacturing method of the semiconductor device according to the present embodiment will be described with reference to FIGS. 20A to 21D. Each of FIGS. 20A to 21D is a cross-sectional view illustrating a process of the manufacturing method of the semiconductor device according to the present embodiment.

Figure 20A:
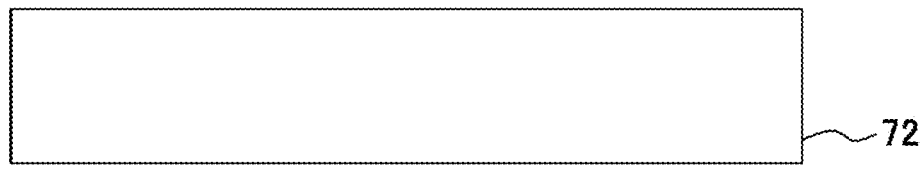
FIG. 20A is a cross-sectional view (first cross-sectional view) illustrating a process of a manufacturing method of a semiconductor device according to the third embodiment.

First, as illustrated in FIG. 20A, the base crystal substrate 72 formed from the n type conductive 6H-SiC substrate is prepared as the base crystal substrate 72.

Figure 20B:
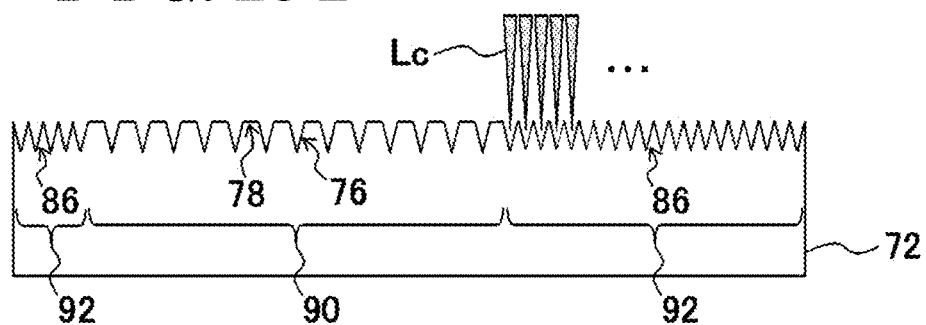
FIG. 20B is a cross-sectional view (first cross-sectional view) illustrating a process of the manufacturing method of the semiconductor device according to the third embodiment.

Next, as illustrated in FIG. 20B, the surface of the base crystal substrate 72 is irradiated with an ultrashort-pulse laser Lc, and accordingly the plural processed portions 76 are formed at the surface of the base crystal substrate 72 in the crystal growth region 90 and the plural processed portion 86 are formed in the crystal non-growth region 92. The laser processing apparatus illustrated in FIG. 4 may be used for the irradiation of the ultrashort-pulse laser Lc. During the irradiation with the ultrashort-pulse laser Lc, the ultrashort-pulse laser Lc including the circular cross section is radiated or delivered to each lattice point of the square lattice or the hound's-tooth check of the surface of the base crystal substrate 72. At this time, the lattice points which are irradiated with the ultrashort-pulse laser Lc are more closely spaced from each other in the crystal non-growth region 92 than in the crystal growth region 90, that is, the lattice points which are irradiated with the ultrashort-pulse laser Lc are denser in the crystal non-growth region 92 than in the crystal growth region 90. In consequence, the conical recessed portions are formed as the processed portions 76, 86 by the irradiation with the ultrashort-pulse laser light Lc as described above.

In a similar manner to the second embodiment, in the crystal growth region 90, the plural processed portions 76 processed by the irradiation with the ultrashort-pulse laser light form the lattice pattern, and the portion between the adjacent processed portions 76 corresponds to the unprocessed portion 78. In a similar manner to the processed portions 56 of the second embodiment, the nano periodic structure 60 (refer to FIGS. 17A and 17B) is formed at a surface inside each of the processed portions 76 by the abrasion caused by the irradiation with the ultrashort-pulse laser light.

On the other hand, in the crystal non-growth region 92, the lattice pattern is formed by the plural the processed portions 86 processed by the irradiation with the ultra-short pulse laser light, however, the processed portions 86 are formed and arranged with substantially no clearance therebetween with the higher density compared to the processed portions 76. Thus, the unprocessed portion that has not been irradiated with the ultrashort-pulse laser light is not substantially present between the adjacent processed portions 86. A region surrounded by the four processed portions 86 which are adjacent with one another, although the region is a small region, corresponds to the unprocessed portion which has not been irradiated with the ultrashort-pulse laser light. In a similar manner to the processed portions 56 of the second embodiment, the nano periodic structure 60 (refer to FIGS. 17A and 17B) is formed at the surface within each processed portion 86 by the abrasion caused by the irradiation with the ultrashort-pulse laser light. Because the plural processed portions 86 are formed with the relatively high density, the crystal non-growth region 92 is the region in which the crystal growth of the semiconductor crystal layer does not occur throughout the entire surface of the crystal non-growth region 92. By forming the plural processed portions 86 at the high density and thus increasing a ratio of the processed portions 86 to the unprocessed portions as described above, the crystal non-growth region 92 is formed in which the crystal growth of the semiconductor crystal layer does not occur.

In addition, the plural processed portions 76 and 86 are formed in a manner that the crystal growth region 90 that is defined by the plural processed portions 76 and 86 includes the predetermined pattern.

Figure 20C:
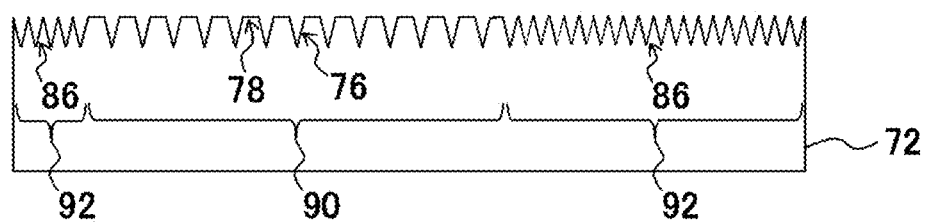
FIG. 20C is a cross-sectional view (first cross-sectional view) illustrating a process of the manufacturing method of the semiconductor device according to the third embodiment.

Next, the foreign materials on the surface of the base crystal substrate 72 are removed by, for example, the wet etching as illustrated in FIG. 20C so that the surface of the base crystal substrate 72 becomes the clean surface.

After the surface of the base crystal substrate 72 is made to be the clean surface, the semiconductor crystal layer 74 formed from the n type GaN is crystal-grown on the base crystal substrate 72 by the MOCVD method. As the source materials, the TMG is used as the group III source gas and $NH_3$ is used as the group V source gas.

Figure 21A:
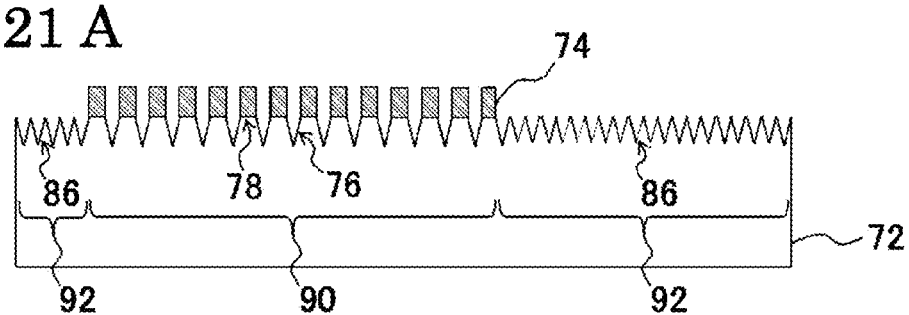
FIG. 21A is a cross-sectional view (second cross-sectional view) illustrating a process of the manufacturing method of the semiconductor device according to the third embodiment.

As the growth condition at the early growth stage, the V/III ratio is 1000, for example, and the growth temperature is 1040° C., for example. As illustrated in FIG. 21A, at the early growth stage, the semiconductor crystal layer 74 crystal grows selectively on the unprocessed portions 78 of the surface of the base crystal substrate 72 in the crystal growth region 90 and the semiconductor crystal layer 74 does not crystal-grow inside the processed portions 76. On the other hand, the semiconductor crystal layer 74 does not crystal-grow in the crystal non-growth region 92 throughout the surface thereof. In consequence, the semiconductor crystal layer 74 including a thickness of, for example, 200 nm to 1000 nm, is selectively grown on the unprocessed portions 78 in the crystal growth region 90.

Figure 21B:
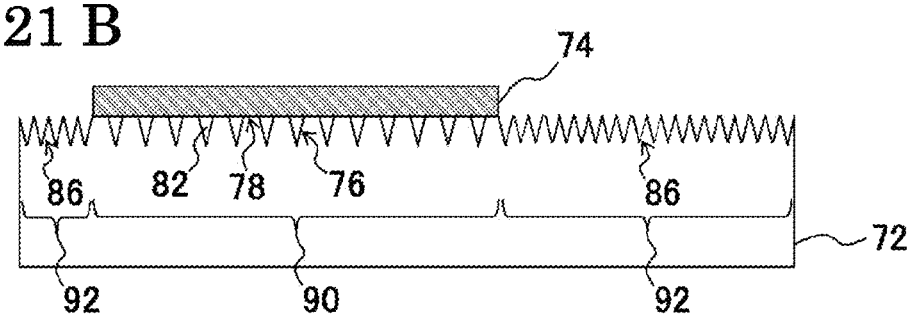
FIG. 21B is a cross-sectional view (second cross-sectional view) illustrating a process of the manufacturing method of the semiconductor device according to the third embodiment.

Next, the growth condition of the semiconductor crystal layer 74 is changed and thus the semiconductor crystal layer 74, which has been selectively grown on the unprocessed portions 78 in the crystal growth region 90, is grown in the lateral direction (lateral growth). Specifically, among the growth conditions, the V/III ratio is changed from, for example, 1000 to, for example, 3000. The growth temperature remains at 1040° C., for example. Accordingly, the semiconductor crystal layer 74 grows in the lateral direction under the growth condition that is different from the growth condition of the early growth, and consequently, the processed portions 76 come to be covered with the semiconductor crystal layer 74 in the crystal growth region 90 as illustrated in FIG. 21B. Here, the growth of the semiconductor crystal layer 74 is switched from the growth in an upper direction of the base crystal substrate 72 to the growth in the lateral direction by changing the V/III ratio, however, the growth of the semiconductor crystal layer 74 can be switched to the growth in the lateral direction by changing the flow volume of the source gas and/or the growth temperature, for example.

Accordingly, in the crystal growth region 90, the semiconductor crystal layer 74 is grown in the lateral direction until the processed portions 76 are substantially or almost covered with the semiconductor crystal layer 74. The surface of the semiconductor crystal layer 74 becomes substantially flat. In addition, the air gap 82 is generated between the semiconductor crystal layer 74 covering the processed portions 76, and the inner wall surface of each processed portion 76. After this, the direction in which semiconductor crystal layer 74 grows may be switched by changing again the growth condition of the semiconductor crystal layer 74, including the V/III rate, the flow volume of the source gas and/or the growth temperature, so that the semiconductor crystal layer 74 is crystal-grown in the upper direction of the base crystal substrate 72.

In consequence, the semiconductor crystal layer 74 is crystal-grown in the crystal growth region 90 including the predetermined pattern.

Next, the n type contact layer 26 which is formed from the n type GaN and of which the thickness is, for example, 3000 nm is grown on the semiconductor crystal layer 74 by the MOCVD method.

Next, the n type clad layer 28 of which the thickness is, for example, 200 nm and which is formed from n type AlGaN is grown on the n type contact layer 26 by the MOCVD method.

Next, the three barrier layers each formed by the non-doped GaN and including the thickness of, for example, 4 nm and the three well layers each formed from the non-doped $In_{0.3}Ga_{0.7}N$ and including the thickness of, for example, 3 nm are grown on the n type clad layer 28 by the MOCVD method in a manner that the barrier layer and the well layer are alternately layered on each other and that the barrier layer is arranged on the topmost layer. Thus, the multiple quantum well layer 30, where the barrier layers and the well layers are layered alternately with each other, is formed on the n type clad layer 28.

Next, the p type clad layer 32 which is formed from p type AlGaN and of which the thickness is, for example, 100 nm is grown on the multiple quantum well layer 30 by the MOCVD method.

Next, the p type contact layer 34 which is formed from p type GaN and of which the thickness is, for example, 500 nm is grown on the p type clad layer 32 by the MOCVD method.

Figure 21C:
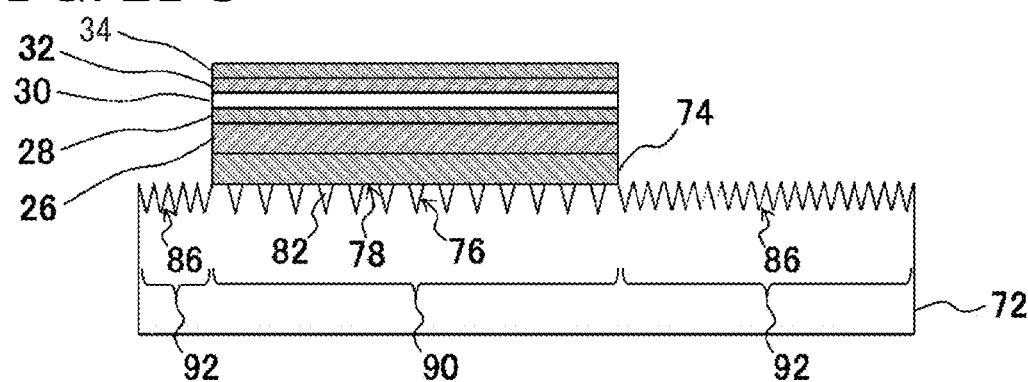
FIG. 21C is a cross-sectional view (second cross-sectional view) illustrating a process of the manufacturing method of the semiconductor device according to the third embodiment.

In consequence, as illustrated in FIG. 21C, on the semiconductor crystal layer 74, the n type contact layer 26, the n type clad layer 28, the multiple quantum well layer 30, the p type clad layer 32 and the p type contact layer 34 are sequentially layered. The n type clad layer 28, the multiple quantum well layer 30, the p type clad layer 32 and the p type contact layer 34 selectively crystal-grow in the crystal growth region 90 but the n type clad layer 28, the multiple quantum well layer 30, the p type clad layer 32 and the p type contact layer 34 do not crystal grow in the crystal non-growth region 92. Thus, in the present embodiment, the processed portions 76 and 86 are formed in advance in a manner that the crystal growth region 90 includes a desired pattern. Accordingly, a process can be eliminated, in which etching is performed so that the n type contact layer 26, the n type clad layer 28, the multiple quantum well layer 30, the p type clad layer 32 and the p type contact layer 34 are processed into the desired pattern.

In a similar manner to the semiconductor crystal layer 54 of the second embodiment, the defect, and/or distortion or deformation are reduced and the abnormal growth is restrained from occurring at the semiconductor crystal layer 74. Consequently, in the present embodiment, the n type contact layer 26, the n type clad layer 28, the multiple quantum well layer 30, the p type clad layer 32 and the p type contact layer 34 are formed to include appropriate qualities. As a result, according to the present embodiment, the semiconductor device 84 including the excellent device characteristic and the high performance can be manufactured.

Next, the transparent conductive oxide film of, for example, ITO is formed at the entire surface of the p type contact layer 34, and thereafter the patterning is applied to the transparent conductive oxide film by using photolithography and etching. Thus, the transparent electrode 36 made of the transparent conductive oxide is formed on the p type contact layer 34.

Next, the n type electrode 88 is formed on the crystal non-growth region 92 of the base crystal substrate 72 by the lift-off method. The n type electrode 88 is formed from the Ti film and the Al film which are sequentially layered on each other. In addition, the p type electrode 40 is formed on the transparent electrode 36 by the lift-off method. The p type electrode 40 is formed from the Ni film and the Au film which are sequentially layered on each other. The n type electrode 88 and the p type electrode 40 may be formed by the evaporation method using the mask.

Figure 21D:
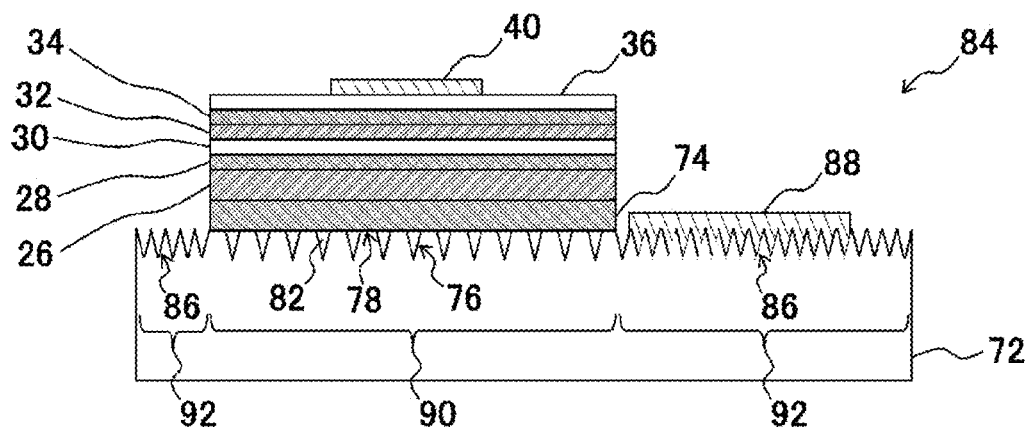
FIG. 21D is a cross-sectional view (second cross-sectional view) illustrating a process of the manufacturing method of the semiconductor device according to the third embodiment.

In consequence, the transparent electrode 36, the n type electrode 88 and the p type electrode 40 are formed as illustrated in FIG. 21D.

Thereafter, for example, the protective film protecting the surface is formed and the dicing or die cutting is performed to obtain the chips, and accordingly the semiconductor device 84 according to the present embodiment is manufactured.

In the present embodiment, the n type contact layer 26, the n type clad layer 28, the multiple quantum well layer 30, the p type clad layer 32 and the p type contact layer 34 can be formed in the desired pattern without the need for processing after the crystal growth. Consequently, according to the present embodiment, the semiconductor device 84 is manufactured in the reduced number of processes.

Modified embodiments will be described below. The present disclosure is not limited to the aforementioned embodiments and various modifications may be made thereto. For example, the explanation is made on a case where the SiC substrate or the sapphire substrate is used as the base crystal substrate 12, 52, 72 in the aforementioned embodiments, however, the base crystal substrate is not limited thereto. The base crystal substrate can be appropriately chosen depending on the semiconductor crystal layer that is to be crystal-grown. In addition to the sapphire substrate and the SiC substrate, various substrates including the Si substrate, the GaN substrate, GaAs substrate, InP substrate, GaO substrate, ZnO substrates may be used, for example.

In the aforementioned embodiments, the explanation is made on a case where the semiconductor crystal layer 14, 54 made of GaN is crystal-grown, however, the semiconductor crystal layer that is to be crystal-grown is not limited thereto. In addition to the semiconductor crystal layer formed from GaN, a semiconductor crystal layer formed from GaAs, InP, GaO, AnO, for example, may be crystal-grown on the base crystal substrate.

In the aforementioned embodiments, the explanation is made on a case where the MOCVD method is used as the method of growing the semiconductor crystal layer including the semiconductor crystal layer 14, 54, for example, however, the method of growing the semiconductor crystal layer is not limited thereto. In addition to the MOCVD method, various methods of growing the semiconductor crystal layer including a Molecular Beam Epitaxy (MBE) method, for example, may be used. Further, as the method of growing the semiconductor crystal layer constituting LED, various methods of growing the semiconductor crystal layer including the Molecular Beam Epitaxy (MBE) method and an Atomic Layer Deposition (ALD) method, for example, may be used in addition to the MOCVD method.

In the aforementioned embodiments, the explanation is made on a case where the semiconductor device 24, 64, 84 corresponds to LED, however, the semiconductor device is not limited to LED. In addition to LED, various optical semiconductor devices including a semiconductor laser, for example, and various power semiconductor devices including a High Electron Mobility Transistor (HEMT), for example, may be used as the semiconductor device.

In the aforementioned embodiments, the explanation is made on a case where the processed portions 16 form or define the line and space pattern and the processed portions 56, 76, 86 form or define the lattice pattern, however, the patterns formed by the processed portions are not limited thereto. The processed portions can be formed to configure various patterns in addition to the line and space pattern and the lattice pattern.

In the aforementioned embodiments, the explanation is made on a case where the ultrashort-pulse laser light is irradiated or delivered with the use of the scanning optical system 134 including the galvanic scanner 128, however, the irradiation with the ultrashort-pulse laser light is not limited thereto. For example, a mirror and a condensing lens or condenser lens may be used to deliver the ultrashort-pulse laser light to the surface of the base crystal substrate. Alternatively, a cylindrical lens may be used to form the ultrashort-pulse laser light in a linear shape, and then the surface of the base crystal substrate may be irradiated with the ultrashort-pulse laser light formed in the linear shape. Alternatively, a Diffractive Optical Element (DOE) may be used to split the laser beam into plural beams, and then the laser beams split into the plural beams may be irradiated at or delivered to the base crystal substrate at the same time. Alternatively, an ultrashort-pulse laser light including a relatively large diameter of an irradiation spot may be delivered without performing the scanning the ultrashort-pulse laser light.

Further, the following additional remarks are disclosed with regards to the aforementioned embodiments.

(First additional remark) The substrate 10, 50 includes the base crystal substrate 12, 52, 72 including the processed portion 16, 56, 76, 86 processed by the irradiation with the ultrashort-pulse laser light La, Lb, Lc and the unprocessed portion 18, 58, 78 which is not irradiated with the ultrashort-pulse laser light La, Lb, Lc, the processed portion 16, 56, 76, 86 and the unprocessed portion 18, 58, 78 are on the surface of the base crystal substrate 12, 52, 72. The substrate 10, 50 includes the semiconductor crystal layer 14, 54, 74 crystal-grown at least on the unprocessed portion 18, 58, 78 of the base crystal substrate 12, 52, 72.

According to the above-described configuration, the selective growth of the semiconductor crystal layer is realized without the use of the selective growth mask and the semiconductor crystal layer including the appropriate quality is crystal-grown.

(Second additional remark) The substrate 10, 50 according to the first additional remark, wherein the semiconductor crystal layer 14, 54, 74 is crystal-grown to cover the processed portion 16, 56, 76 of the base crystal substrate 12, 52, 72.

(Third additional remark) The substrate 10, 50 according to either the first additional remark or the second additional remark, wherein the base crystal substrate 12, 52, 72 includes on the surface thereof a plurality of the processed portions 16, 56, 76, 86 and the plurality of processed portions 16, 56, 76, 86 form the periodic protrusion/recess structure (i.e., the nano periodic structure 20, 60), and the processed portions 16, 56, 76, 86 each includes the nano periodic structure 20, 60 (i.e., the periodic protrusion/recess structure) formed at the surface within the processed portion 16, 56, 76, 86.

(Fourth additional remark) The substrate 10, 50 according to any one of the first additional remark to the third additional remark, wherein at least the surface layer portion of the surface within the processed portion 16, 56, 76, 86 corresponds to non-crystalline.

(Fifth additional remark) The substrate according to any one of the first additional remark to the fourth additional remark, wherein the processed portion includes the recessed configuration.

(Sixth additional remark) The semiconductor device uses the substrate according to any one of the first additional remark to the fifth additional remark.

(Seventh additional remark) The semiconductor device according to the sixth additional remark, wherein the semiconductor device includes the device structure formed on the semiconductor crystal layer.

(Eighth additional remark) The semiconductor device according to the seventh additional remark, wherein the semiconductor device further includes the active layer formed on the semiconductor crystal layer.

(Ninth additional remark) The semiconductor device 84 includes the base crystal substrate 72 including the processed portion 76, 86 processed by the irradiation with the ultrashort-pulse laser light Lc and the unprocessed portion 78 which is not irradiated with the ultrashort-pulse laser light Lc, the processed portion 76, 86 and the unprocessed portion 78 are formed on the surface of the base crystal substrate 72, the base crystal substrate 72 including on the surface thereof the crystal growth region 90 (i.e., the first region) in which a plurality of the processed portions 76 are formed and the crystal non-growth region 92 (i.e., the second region) in which a plurality of the processed portions 86 are formed with the higher density than in the crystal growth region 90, and the semiconductor crystal layer 74 crystal-grown in the crystal growth region 90, the semiconductor crystal layer 74 being not crystal-grown in the crystal non-growth region 92.

(Tenth additional remark) The semiconductor device described in the ninth additional remark, wherein the semiconductor device further includes the electrode formed directly in the crystal non-growth region of the substrate.

(Eleventh additional remark) The manufacturing method of the substrate 10, 50, the manufacturing method includes the laser processing process of irradiating the surface of the base crystal substrate 12, 52, 72 with the ultrashort-pulse laser light La, Lb, Lc and thereby forming the processed portion 16, 56, 76, 86 on the surface of the base crystal substrate 12, 52, 72, and the first crystal growth process of crystal-growing the semiconductor crystal layer 14, 54, 74 on the unprocessed portion 18, 58, 78 of the surface of the base crystal substrate 12, 52, 72, the unprocessed portion 18, 58, 78 being not irradiated with the ultrashort-pulse laser light La, Lb, Lc.

(Twelfth additional remark) The method of manufacturing the substrate according to the eleventh additional remark, the method further includes, after the first crystal growth process, a second crystal growth process of crystal-growing the semiconductor crystal layer crystal-grown on the unprocessed portion of the substrate in a manner that the semiconductor crystal layer covers the processed portion of the substrate.

(Thirteenth additional remark) The method of manufacturing the substrate according to the twelfth additional remark, wherein, in the second crystal growth process, the semiconductor crystal layer is crystal-grown under the growth condition that is different from the growth condition in the first crystal growth process.

(Fourteenth additional remark) The method of manufacturing the substrate according to any one of the eleventh additional remark to the thirteenth additional remark, wherein the plural processed portions forming the predetermined pattern are formed in the laser processing process.

(Fifteenth additional remark) The manufacturing method of the semiconductor device 24, 64, 84 uses the manufacturing method of the substrate 10, 50 according to any one of the eleventh additional remark to the fourteenth additional remark.

(Sixteenth additional remark) The laser processing apparatus 102 includes the laser light source 110 emitting the ultrashort-pulse laser light La, Lb, Lc, and the control portion 114 delivering the ultrashort-pulse laser light La, Lb, Lc to the surface of the base crystal substrate 12, 52, 72 at which the semiconductor crystal layer 14, 54, 74 is to be crystal-grown and thereby forming the processed portion 16, 56, 76, 86 at the surface of the base crystal substrate 12, 52, 72.

According to the aforementioned embodiments, the processed portion 16 forms the periodic line and space pattern.

According to the aforementioned embodiments, the processed portion 16, 56, 76, 86 includes the nano periodic structure 20, 60 formed at the surface of the processed portion 16, 56, 76, 86 and corresponding to the periodic fine protrusion/recess structure including the nanometer cycle.

The principles, preferred embodiments and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed:

1. A substrate comprising:
   a base substrate including a processed portion processed by irradiation with an ultrashort-pulse laser light and an unprocessed portion which is not irradiated with the ultrashort-pulse laser light, the processed portion and the unprocessed portion are on a surface of the base substrate; and
   a semiconductor crystal layer crystal-grown at least on the unprocessed portion of the base substrate.

2. The substrate according to claim 1, wherein the semiconductor crystal layer is crystal-grown to cover the processed portion of the base substrate.

3. The substrate according to claim 1, wherein
   the base substrate includes on the surface thereof a plurality of the processed portions and the plurality of the processed portions form a periodic pattern, and
   the processed portions each includes a periodic protrusion/recess structure formed at a surface within the processed portion.

4. The substrate according to claim 1, wherein at least a surface layer portion of the surface within the processed portion corresponds to non-crystalline.

5. The substrate according to claim 1, wherein the processed portion forms a periodic line and space pattern.

6. The substrate according to claim 1, wherein the processed portion includes a nano periodic structure formed at a surface of the processed portion and corresponding to a periodic fine protrusion/recess structure including a nanometer cycle.

7. A semiconductor device comprising:
   a base substrate including a processed portion processed by irradiation with an ultrashort-pulse laser light and an unprocessed portion which is not irradiated with the ultrashort-pulse laser light, the processed portion and the unprocessed portion are formed on a surface of the base substrate, the base substrate including on the surface thereof a first region in which a plurality of the processed portions are formed and a second region in which a plurality of the processed portions are formed with a higher density than in the first region; and
   a semiconductor crystal layer crystal-grown in the first region, the semiconductor crystal layer being not crystal-grown in the second region.

8. A manufacturing method of a substrate, the manufacturing method comprising:
   a laser processing process of irradiating a surface of a base substrate with an ultrashort-pulse laser light and thereby forming a processed portion on the surface of the base substrate; and
   a first crystal growth process of crystal-growing a semiconductor crystal layer on an unprocessed portion of the surface of the base substrate, the unprocessed portion being not irradiated with the ultrashort-pulse laser light.

* * * * *